(12) United States Patent
Ohuchi

(10) Patent No.: US 8,048,762 B2
(45) Date of Patent: Nov. 1, 2011

(54) MANUFACTURING METHOD OF SEMICONDUCTOR DEVICE

(75) Inventor: Masahiko Ohuchi, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 182 days.

(21) Appl. No.: 12/546,938

(22) Filed: Aug. 25, 2009

(65) Prior Publication Data

US 2010/0130019 A1    May 27, 2010

(30) Foreign Application Priority Data

Aug. 25, 2008   (JP) ................................. 2008-215129

(51) Int. Cl.
*H01L 21/76* (2006.01)

(52) U.S. Cl. ........ 438/424; 438/425; 438/670; 438/671; 438/672

(58) Field of Classification Search .................. None
See application file for complete search history.

(56) References Cited

U.S. PATENT DOCUMENTS

| | | | | |
|---|---|---|---|---|
| 6,063,688 A | * | 5/2000 | Doyle et al. | 438/424 |
| 7,531,456 B2 | * | 5/2009 | Kwon et al. | 438/671 |
| 7,615,496 B2 | * | 11/2009 | Lee et al. | 438/736 |
| 7,718,540 B2 | * | 5/2010 | Tran et al. | 438/717 |
| 7,816,262 B2 | * | 10/2010 | Juengling | 438/669 |
| 7,943,481 B1 | * | 5/2011 | Kim | 438/424 |

FOREIGN PATENT DOCUMENTS

JP    2008-027978    2/2008

* cited by examiner

*Primary Examiner* — Duy Deo
(74) *Attorney, Agent, or Firm* — Young & Thompson

(57) ABSTRACT

A manufacturing method for a semiconductor device includes: forming a first layer on a member to be etched; forming a first hard mask that includes a first hard mask pattern, in the first layer; forming a second layer on the first hard mask and on an exposed surface of the member to be etched; removing by selective etching the second layer to form a side wall core that includes a core pattern; forming side wall spacers on side walls of the side wall core; and using the side wall spacers and the first hard mask to remove by etching the member to be etched.

20 Claims, 40 Drawing Sheets

MANUFACTURING METHOD OF SEMICONDUCTOR DEVICE

This application is based on and claims priority from Japanese Patent Application No. 2008-215129 filed on Aug. 25, 2008. The disclosure thereof is incorporated herein by reference in its entirety.

BACKGROUND OF THE INVENTION

1. Field of the Invention

This invention relates to a manufacturing method for a semiconductor device, and more particularly, to a manufacturing method for a semiconductor device, including forming a fine pattern of a size smaller than a resolution limit of lithography using side wall spacers as a mask.

2. Description of the Related Art

A photolithography technique in a conventional semiconductor technology generally involves etching a base silicon substrate and a silicon oxide film using as a mask a photoresist pattern obtained by exposure and development through a photomask. However, as the pattern becomes finer, a type of light source used in the exposure has been changed, with the result that an etching resistance of a photoresist suited to the light source has been lowered. Therefore, the following technique is frequently used for pattern formation. That is, the pattern is once transferred by etching to a base film (for example, silicon nitride film) having a thickness that is relatively thin but thick enough to enable the photoresist to endure, using as a mask the photoresist pattern obtained through the photomask. Then, an original layer to be processed (for example, silicon oxide film), which is a base film of the silicon nitride film, is etched using the silicon nitride film as a mask, to thereby form the pattern. A silicon nitride film patterned in this manner is called a hard mask.

In recent years, demands for miniaturization and higher density of a semiconductor memory or the like have surpassed a development speed of a lithography technique concerning, for example, an exposure apparatus or a photoresist. As a result, a method of forming a pattern of a size smaller than a resolution limit of lithography has attracted attention. As an example of such a method, Patent Document 1 (U.S. Pat. No. 6,063,688) discloses a technology of etching a layer under side wall spacers using the side wall spacers as a hard mask, to thereby form a fine pattern of a size smaller than a resolution limit of lithography.

In the method of forming a pattern using the side wall spacers as a hard mask, there are some points to be considered with regard to the side wall spacers. For example, (1) only a pattern having a fixed width that is determined by a film thickness of the side wall spacers may be formed, and thus the side wall spacers may not serve to form a pattern of an arbitrary size. (2) Both in a case where the side wall spacers are formed on outer side walls in an island-like pattern and in a case where the side wall spacers are formed on inner walls of an opening portion formed in an insulating layer, the side wall spacers are formed inevitably in a "loop-like" shape. When a line-and-space pattern is formed, end portions of different lines or end portions of different spaces are connected to each other, which requires to isolate a line pattern or a space pattern. (3) There is no mask pattern in a region in which the hard mask of the side wall spacers is not formed. Therefore, in a case where a space pattern or a hole pattern of a size smaller than a resolution limit of lithography is formed using the side wall spacers as a hard mask, it is necessary to prepare a large pattern that covers an entire surface of a region other than a region in which the above-mentioned fine patterns are formed.

In the technology disclosed in Patent Document 1, an entire surface of a substrate other than a channel region in which the hard mask of the fine side wall spacers is formed is covered with a photoresist. The substrate is etched using the photoresist and the hard mask of the side wall spacers as masks. In this manner, a fine trench pattern is formed only in the channel region on the substrate.

According to the technology described above, the region other than the channel region is covered with the resist, and hence an unnecessary trench is prevented from being formed. Further, the end portions of different lines or the end portions of different spaces are not connected to each other in the line-and-space pattern of the channel region, to thereby achieve isolating the space pattern.

Meanwhile, Patent Document 2 (Japanese Unexamined Patent Application Publication (JP-A) No. 2008-27978) discloses a method of forming a fine pattern of a size smaller than a resolution limit of lithography and, at the same time, forming a pattern of an arbitrary size using side wall spacers as a hard mask.

According to the method disclosed in Patent Document 2, a first core pattern for forming a hard mask of side wall spacers and a second core pattern for forming a pattern of an arbitrary size are formed on a semiconductor substrate in the same photolithography step. Side wall spacers are formed on both side walls of the first core pattern and side walls of the second core pattern. After that, the first core pattern is selectively removed while the second core pattern is left. The second core pattern is also used as a hard mask, to thereby form a hard mask of an arbitrary size.

Patent Document 1: U.S. Pat. No. 6,063,688
Patent Document 2: Japanese Unexamined Patent Application Publication (JP-A) No. 2008-27978

SUMMARY

However, according to Patent Document 1, after the formation of the side wall spacers, in a state where an insulating film formed in a core is removed by etching and the hard mask of the side wall spacers is formed, the photoresist is applied, exposed, and developed on the surface of the substrate, which results in various problems. The side wall spacers as a hard mask are arranged at a fine pitch, and each of the side wall spacers has a certain height. When the photoresist is applied on the surface of the substrate by a conventional method, air bubbles are produced in gaps between the side wall spacers. The air bubbles burst during heat treatment performed before or after the exposure, or cause fluctuations in film thickness of the photoresist, which results in a trouble for the photoresist pattern formation. In addition, there may be a case where reaction products produced in the gaps between the side wall spacers are not completely removed during the development process after the exposure, which also results in the trouble for the photoresist pattern formation. This is caused by the fact that the development process, which is generally employed, has a low capability of removing reaction products.

According to Patent Document 2, the hard mask pattern of an arbitrary size is formed of the second core pattern and the side wall spacers formed on the side walls of the second core pattern. Therefore, an end portion position and a pattern width of the hard mask pattern are affected by fluctuations in thickness of films for the side wall spacers during the formation thereof and fluctuations in etching back during the side wall spacer formation in addition to positioning misalignment in the photolithography step, fluctuations in exposure, fluctuations in development, and fluctuations in etching. Accordingly, there has been a problem that accuracy of a position or size of the pattern is significantly lowered. Particularly, when a positioning monitor mark is formed as a pattern of an arbitrary size, there has been a problem that monitoring accuracy is significantly lowered.

Moreover, with the technology disclosed in Patent Document 2, it is not possible to isolate a line pattern or a space pattern.

This invention has been made in view of the above-mentioned problems of the related art, and is directed to improvements in forming a pattern including a pattern that is formed using side wall spacers as a hard mask and has a size smaller than a resolution limit of lithography, and more particularly, in forming a pattern including both the pattern of the size smaller than the resolution limit of lithography and a pattern of an arbitrary size.

This invention provides a manufacturing method for a semiconductor device, including: forming a first layer on a member to be etched; forming a first hard mask that includes a first hard mask pattern, in the first layer; forming a second layer on the first hard mask and on an exposed surface of the member to be etched; removing by selective etching the second layer to form a side wall core that includes a core pattern; forming side wall spacers on side walls of the side wall core; and removing by etching the member to be etched, using the side wall spacers and the first hard mask.

According to an aspect of this invention, the side wall core includes at least one opening that crosses an opening that defines a microfabrication region, of the first hard mask pattern, and a region of a pattern that defines a process region of an arbitrary size, of the first hard mask pattern is covered with the second layer.

According to another aspect of this invention, the side wall core has a regular arrangement of islands in the opening that defines the microfabrication region, of the first hard mask pattern.

In this case, the forming side wall spacers includes: forming side wall films on side walls of the islands of the side wall core; and etching the side wall films so that the member to be etched is exposed at portions between adjacent islands.

According to this invention, it is sufficient to perform two photolithography steps in total, that is, a step of forming the first hard mask pattern and a step of forming the pattern of the size smaller than the resolution limit of lithography. Therefore, it is possible to form the pattern including both the pattern of the size smaller than the resolution limit of lithography and the pattern of an arbitrary size, only with the two photolithography steps.

BRIEF DESCRIPTION OF THE DRAWINGS

FIG. 1 illustrate a first exemplary embodiment of this invention, in which

FIG. 2 illustrate a step subsequent to that of FIG. 1, in which

FIG. 3 illustrate a step subsequent to that of FIG. 2, in which

FIG. 4 illustrate a step subsequent to that of FIG. 3, in which

FIG. 5 illustrate a step subsequent to that of FIG. 4, in which

FIG. 6 illustrate a step subsequent to that of FIG. 5, in which

FIG. 7 illustrate a step subsequent to that of FIG. 6, in which

FIG. 8 illustrate a step subsequent to that of FIG. 7, in which

FIG. 9 illustrate a second exemplary embodiment of this invention, in which

FIG. 10 illustrate a step subsequent to that of FIG. 9, in which

FIG. 11 illustrate a step subsequent to that of FIG. 10, in which

FIG. 12 illustrate a step subsequent to that of FIG. 11, in which

FIG. 13 illustrate a step subsequent to that of FIG. 12, in which

FIG. 14 illustrate a step subsequent to that of FIG. 13, in which

FIG. 15 illustrate a step subsequent to that of FIG. 14, in which

FIG. 16 illustrate a step subsequent to that of FIG. 15, in which

FIG. 17 illustrate a third exemplary embodiment of this invention, in which

FIG. 18 illustrate a step subsequent to that of FIG. 17, in which

FIG. 19 illustrate a step subsequent to that of FIG. 18, in which

FIG. 20 illustrate a step subsequent to that of FIG. 19, in which

FIG. 21 illustrate a step subsequent to that of FIG. 20, in which

FIG. 22 illustrate a step subsequent to that of FIG. 21, in which

FIG. 23 illustrate a step subsequent to that of FIG. 22, in which

FIG. 24 illustrate a step subsequent to that of FIG. 23, in which

FIG. 25 illustrate a step subsequent to that of FIG. 24, in which

FIG. 26 illustrate a step subsequent to that of FIG. 25, in which

FIG. 27 illustrate a step subsequent to that of FIG. 26, in which

FIG. 28 illustrate a fourth exemplary embodiment of this invention, in which

FIG. 29 illustrate a step subsequent to that of FIG. 28, in which

FIG. 30 illustrate a step subsequent to that of FIG. 29, in which

FIG. 31 illustrate a step subsequent to that of FIG. 30, in which

FIG. 32 illustrate a step subsequent to that of FIG. 31, in which

FIG. 33 illustrate a step subsequent to that of FIG. 32, in which

FIG. 34 illustrate a step subsequent to that of FIG. 33, in which

FIG. 35 illustrate a step subsequent to that of FIG. 34, in which

FIG. 36 illustrate a step subsequent to that of FIG. 35, in which

FIG. 38 illustrate three memory cells related to this invention, in which

FIG. 39 illustrate a manufacturing process for a PRAM related to this invention, in which

FIG. 40 illustrate a step subsequent to that of FIG. 39 related to this invention, in which FIG. 41 illustrate a step subsequent to that of FIG. 40 related to this invention, in which

DETAILED DESCRIPTION OF THE EXEMPLARY EMBODIMENTS

Figure 1A:
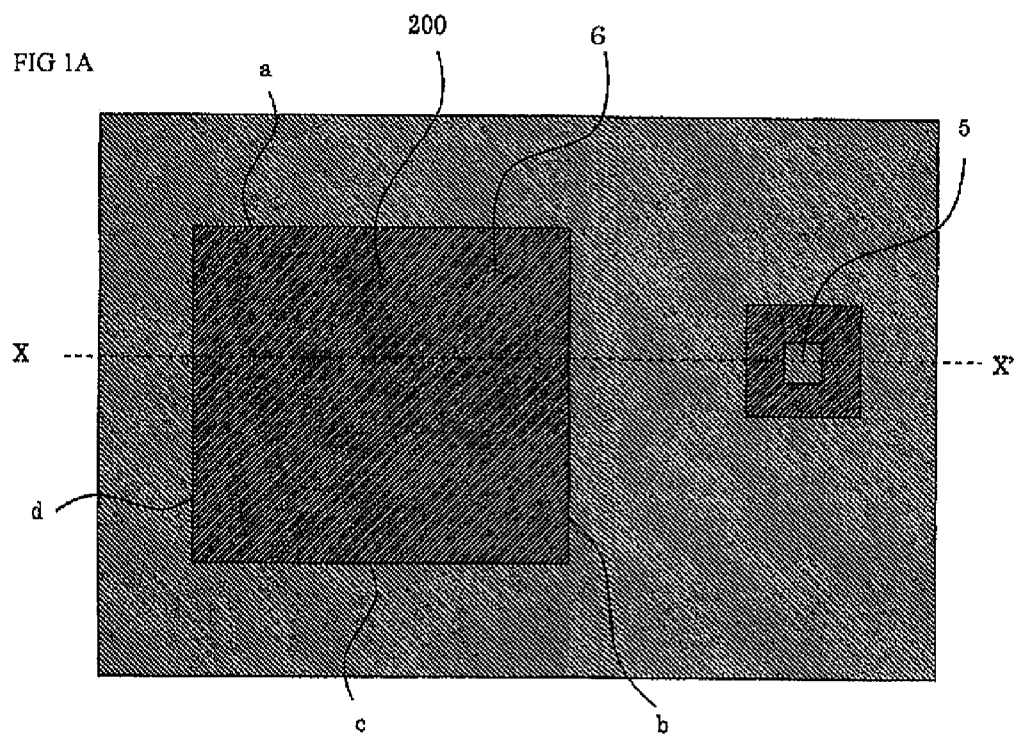
FIG. 1(a) is a plan view.

This invention is understood best by reading "DETAILED DESCRIPTION OF THE EXEMPLARY EMBODIMENTS" with reference to the accompanying drawings. It should be emphasized that various parts illustrated in the drawings are not necessarily proportional to one another according to a normal practical manner. Moreover, for a purpose of clarity, the sizes of various illustrated parts are appropriately increased or reduced, and are not indicative of actual or relative sizes of the various parts.

In the following, a phase-change random access memory (PRAM) device is briefly described as an example of a semiconductor device to which this invention is suitably applied.

Figure 37:
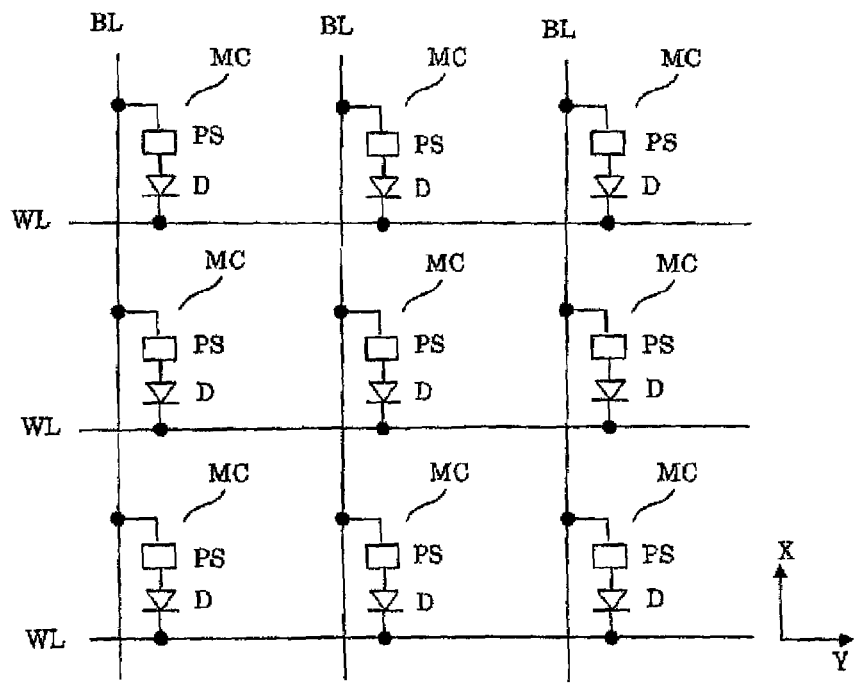
FIG. 37 is a circuit diagram illustrating a phase-change random access memory (PRAM) cell array related to this invention.

FIG. 37 is a circuit diagram illustrating an example of a memory cell array of PRAMs.

With reference to FIG. 37, a plurality of word lines WL and a plurality of bit lines BL are arranged so as to orthogonally intersect with each other. A memory cell MC is provided at an intersection between each word line WL and each bit line BL. The memory cell MC includes a series circuit formed of a phase-change material device PS and a diode D. One end of the phase-change material device PS is connected to a corresponding bit line BL while one end of the diode D is connected to a corresponding word line WL. The phase-change material device PS have electrical resistance values different from each other and may have two stable states which are capable of making a mutually reversible transition therebetween. The electrical resistance values of the phase-change material device PS are detected, to thereby read programmed information. When the memory cell MC is not selected, the diode D is reverse-biased and controlled to be in a non-conductive state. When the memory cell MC is selected, the diode D is controlled to be in a conductive state with the corresponding bit line BL being applied with a high potential and the corresponding word line WL being applied with a low potential. As a result, current is caused to flow through the phase-change material device PS, and the electrical resistance values of the phase-change material device PS are detected.

Figure 38A:
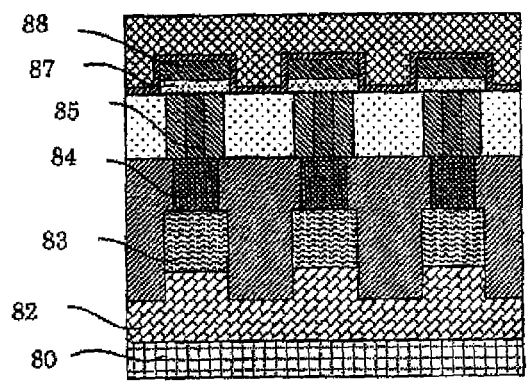
FIG. 38(a) is a cross sectional view taken in a word line direction of FIG. 37.
Figure 38B:
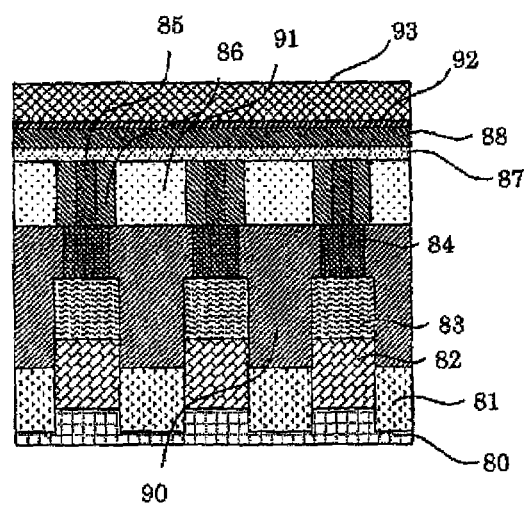
FIG. 38(b) is a cross sectional view taken in a bit line direction of FIG. 37.

FIG. 38(a) is a cross sectional view taken in a word line WL direction of each memory cell MC, and FIG. 38(b) is a cross sectional view taken in a bit line BL direction of each memory cell MC. FIGS. 38(a) and 38(b) each illustrate a three-bit memory cell.

With reference to FIGS. 38(a) and 38(b), an n-type impurity diffusion layer 82 formed on a p-type silicon substrate 80 forms the word lines WL. Adjacent word lines WL are isolated from each other by a silicon oxide layer 81. The n-type impurity diffusion layer 82 and a p-type impurity diffusion layer 83 are formed as silicon pillars on the silicon substrate, to thereby form the diodes D. The silicon pillars are isolated from each other by an insulating layer 90. A phase-change material layer 87 is sandwiched between heater electrodes 85 and upper electrodes 88 to form the phase-change material devices PS. The phase-change material layer 87 and each diode D are connected to each other in series via a metal plug 84. The upper electrode 88 is extendedly formed and commonly connected to the plurality of memory cells so as to function as the bit line BL. The phase-change material layer 87 is covered with an interlayer insulating film 93 via an anti-deterioration protective insulating film 92. The heater electrode 85 is formed so as to have a diameter restricted to be small by an insulating layer 86 formed on an inner wall of an opening formed in an insulating layer 91, which realizes a high current density.

Next, a manufacturing process for the PRAM illustrated by an example is briefly described.

Figure 39A:
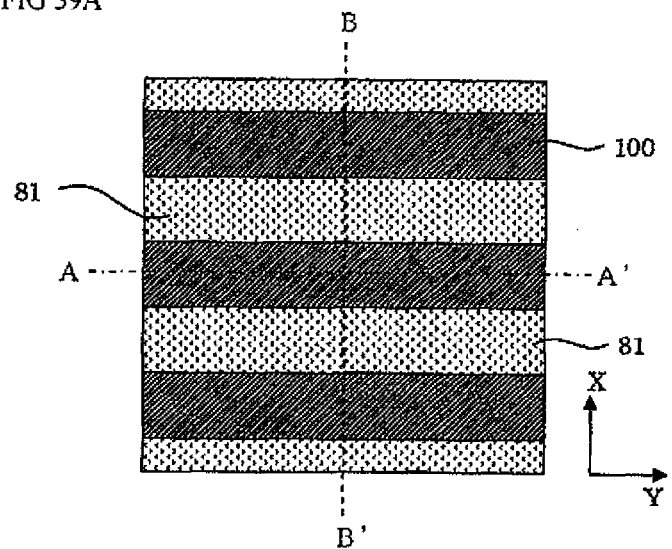
FIG. 39(a) is a plan view.
Figure 39B:
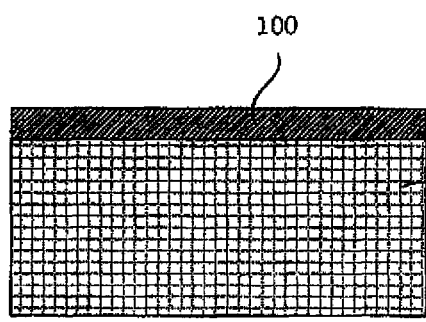
FIG. 39(b) is a cross sectional view taken along the line A-A' of FIG. 39(a)
Figure 39C:
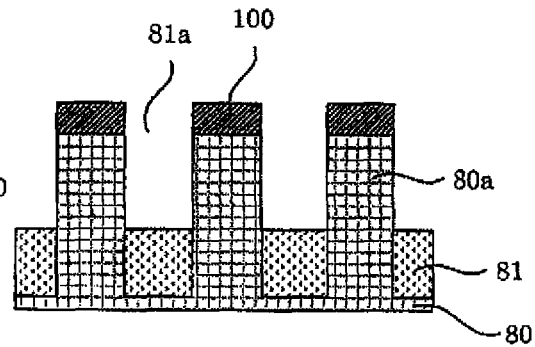
FIG. 39(c) is a cross sectional view taken along the line B-B' of FIG. 39(a)
Figure 40A:
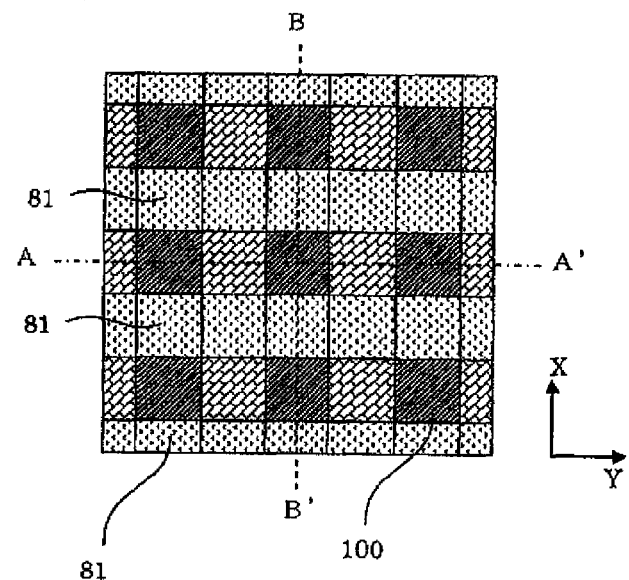
FIG. 40(a) is a plan view.
Figure 40B:
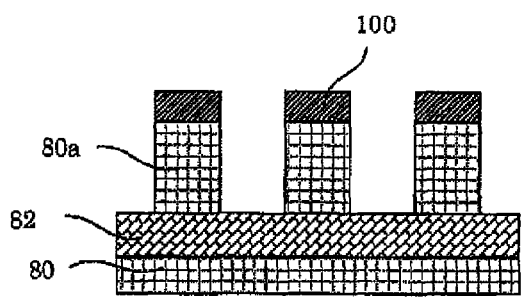
FIG. 40(b) is a cross sectional view taken along the line A-A' of FIG. 40(a)
Figure 40C:
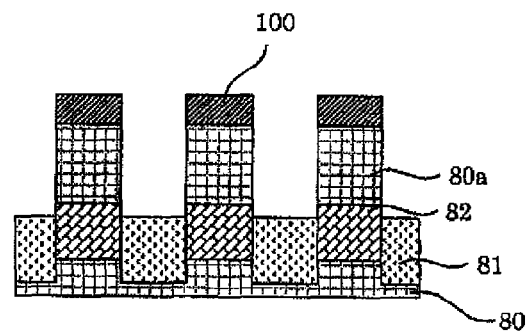
FIG. 40(c) is a cross sectional view taken along the line B-B' of FIG. 40(a)
Figure 41A:
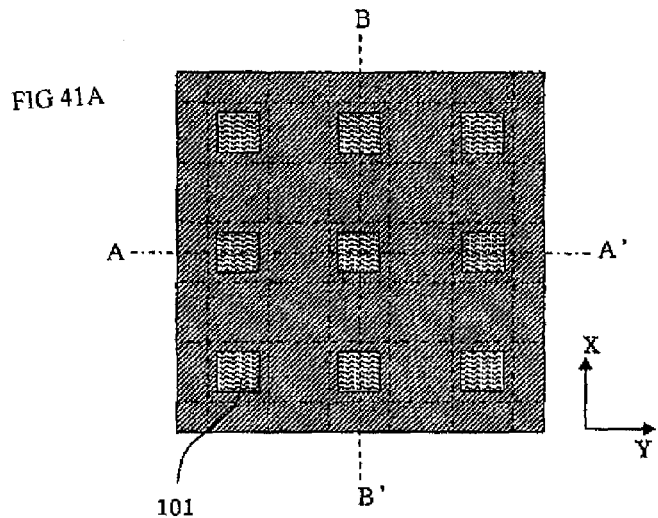
FIG. 41(a) is a plan view.
Figure 41B:
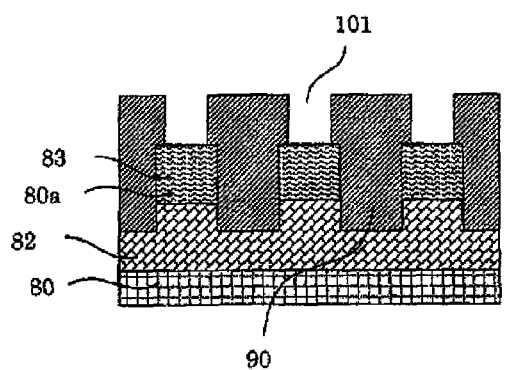
FIG. 41(b) is a cross sectional view taken along the line A-A' of FIG. 41(a)
Figure 41C:
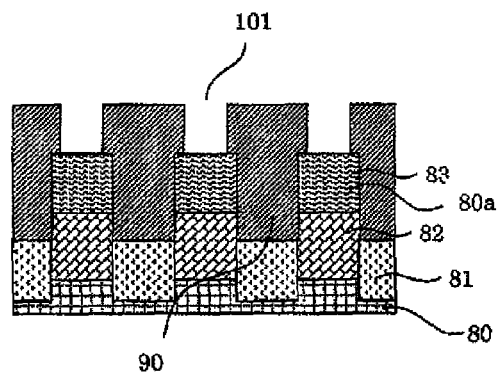
FIG. 41(c) is a cross sectional view taken along the line B-B' of FIG. 41(a).

FIGS. 39(a) to 41(c) illustrate the manufacturing process for the PRAM illustrated by an example. FIGS. 39(a), 40(a), and 41(a) are plan views. FIGS. 39(b), 40(b), and 41(b) are cross sectional views taken along the lines A-A' of FIGS. 39(a), 40(a), and 41(a), respectively. FIGS. 39(c), 40(c), and 41(c) are cross sectional views taken along the lines B-B' of FIGS. 39(a), 40(a), and 41(a), respectively.

First, a p-type silicon substrate 80 is provided. As illustrated in FIGS. 39(a) to 39(c), the silicon substrate 80 is etched by 200 nm using an amorphous carbon hard mask 100 as a mask, to thereby form isolation trenches that extend in a Y direction. In a plane pattern of the hard mask for forming the isolation trenches, space patterns (light pattern portions), which have a width of 30 nm and extend in the Y direction, are arranged at a pitch of 60 nm in an X direction. Accordingly, the isolation trenches may be formed on the surface of the silicon substrate, the surface corresponding to a memory cell array region. On the other hand, in a peripheral control circuit region (not shown) other than the memory cell array region, no trench is formed except for a part of the peripheral control circuit region in which a positioning monitor mark is formed, and hence the surface of the silicon substrate is covered with the hard mask to constitute a dark pattern portion. A method of forming the hard mask is described in detail later. Then, a thick silicon oxide film is formed by chemical vapor deposition (CVD) to fill the isolation trenches. After that, the silicon oxide film is etched back to form the silicon oxide layer 81 for isolating the word lines WL.

Next, as illustrated in FIGS. 40(a) to 40(c), there is formed a hard mask pattern in which space patterns, which orthogonally intersect with the isolation trenches, extend in the X direction, and have a width of 30 nm, are arranged at a pitch of 60 nm in the Y direction. The amorphous carbon hard mask 100 is etched using the hard mask pattern thus formed, to thereby obtain an amorphous carbon hard mask pattern array shaped like islands each having a size of 30 nm×30 nm. The silicon substrate 80 is etched by, for example, 100 nm using the amorphous carbon hard mask 100, to thereby form silicon pillars 80a. Then, n-type impurities such as phosphorus are ion-implanted into the silicon substrate 80. The phosphorus implanted into the surface of the silicon substrate exposed at a bottom of each trench is activated by heat treatment performed after the ion-implantation, and is diffused in the silicon substrate to reach a region below the silicon pillars 80a. As a result, the n-type impurity diffusion layer 82, that is, the word lines WL extending in the Y direction are formed.

Next, as illustrated in FIGS. 41(a) to 41(c), the insulating layer 90 is formed on the surface of the silicon substrate, and then, metal plug openings 101 are formed. P-type impurities are introduced into the silicon pillars 80a to form the p-type impurity diffusion layer 83. As a result, the PN diodes D are formed. In a plane pattern of the hard mask for forming the metal plug openings 101, for example, opening portions each have a size of 24 nm×24 nm, and are arranged at pitches of 60 nm in both the X direction and the Y direction, and the pitch in the X direction and the pitch in the Y direction are equal to each other, that is, intervals between respective adjacent opening portions are equal to each other. In the peripheral control circuit region other than the memory cell array region, no opening portion is formed except for a part of the peripheral control circuit region in which the positioning monitor mark is formed, and hence the surface of the silicon substrate is covered with the hard mask to constitute the dark pattern portion.

Subsequently, though not illustrated, the metal plugs 84, the heater electrodes 85, the phase-change material layer 87, and the upper electrodes 88 are sequentially formed. After that, similarly to a general semiconductor device, an interlayer insulating film, metal wiring, and the like are formed to complete the semiconductor device.

First Exemplary Embodiment

Next, a manufacturing process for a semiconductor device according to a first exemplary embodiment is described.

FIGS. 1 to 8 are views illustrating the manufacturing process for the semiconductor device according to the first exemplary embodiment, particularly, steps of forming a hard mask to process an underlying layer, in which FIGS. 1(a), 2(a), 3(a), 4(a), 5(a), 6(a), 7(a), and 8(a) are plan views, and FIGS. 1(b), 2(b), 3(b), 4(b), 5(b), 6(b), 7(b), and 8(b) are cross sectional views. Here, a description is given of the step of forming the isolation trenches included in the manufacturing process for the PRAM described above by an example. Specifically, the following case is described. There are schematically arranged: a pattern in which five space patterns (light pattern portions), which are formed using side wall spacers as a hard mask and have a width of 30 nm, are arranged at a pitch of 60 nm, in a microfabrication region 6 for the semiconductor device typified by the memory cell array region; and a positioning monitor mark 5 serving as an example of a pattern of an arbitrary size in a region other than the microfabrication region 6. Another region other than the microfabrication region 6 and other than the region in which the positioning monitor mark 5 is formed is a dark pattern portion. Herein, the light pattern portion indicates a region of the mask in which a space or an opening is formed. The dark pattern portion indicates a region of the mask in which a mask material such as a line or island is formed.

Figure 1B:
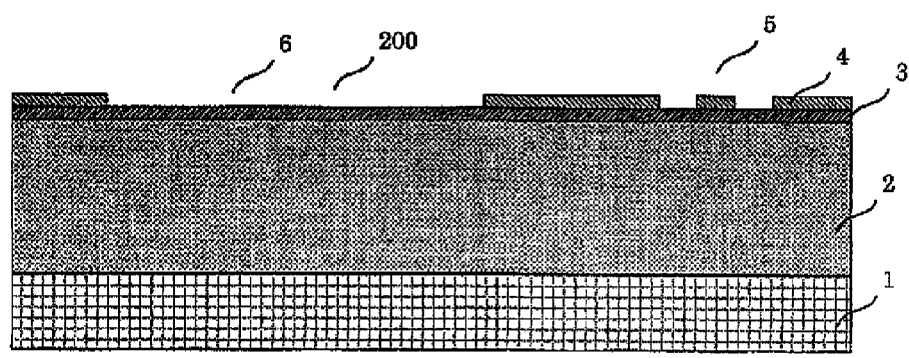
FIG. 1(b) is a cross sectional view taken along the line X-X' of FIG. 1(a)

As illustrated in FIGS. 1(a) and 1(b), an amorphous carbon layer 2, a silicon nitride layer 3, and a polycrystalline silicon layer 4 are sequentially deposited on a silicon substrate 1 being a material to be processed. The amorphous carbon layer 2 serves as a material of a hard mask when the silicon substrate 1 is etched. The silicon nitride layer 3 serves as a material of a hard mask to be used for forming a pattern in the amorphous carbon layer 2. The polycrystalline silicon layer 4 also serves as a material of a hard mask. Then, the polycrystalline silicon layer 4 is processed using a conventional photolithography technique, to thereby form, by patterning, a rectangular opening portion 200, which is surrounded by four lines a, b, c, and d, in the microfabrication region 6 and the positioning monitor mark 5 in the region other than the microfabrication region 6. The positioning monitor mark 5 is defined by an opening that surrounds the positioning monitor mark 5. In the microfabrication region 6 in which the rectangular opening portion 200 is formed, a hard mask pattern of a size smaller than a resolution limit of lithography is formed using the side wall spacers as a hard mask in a subsequent step. On the other hand, the positioning monitor mark 5 is an example of a pattern of an arbitrary size, and may be formed as a pattern of an arbitrary size without limitation due to a pattern width of the hard mask of the side wall spacers. Further, the polycrystalline silicon layer 4 covers the underlying layer (in this case, silicon nitride layer 3) in a region other than the microfabrication region 6 and other than a part in which a pattern of an arbitrary size is formed.

Figure 2A:
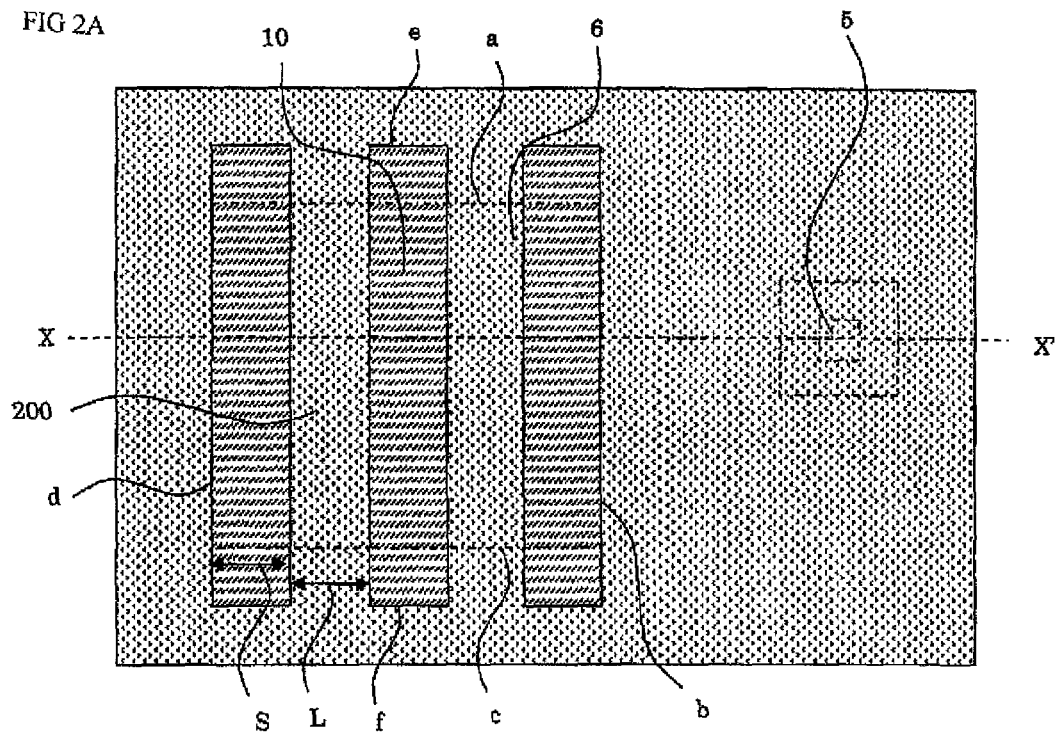
FIG. 2(a) is a plan view.
Figure 2B:
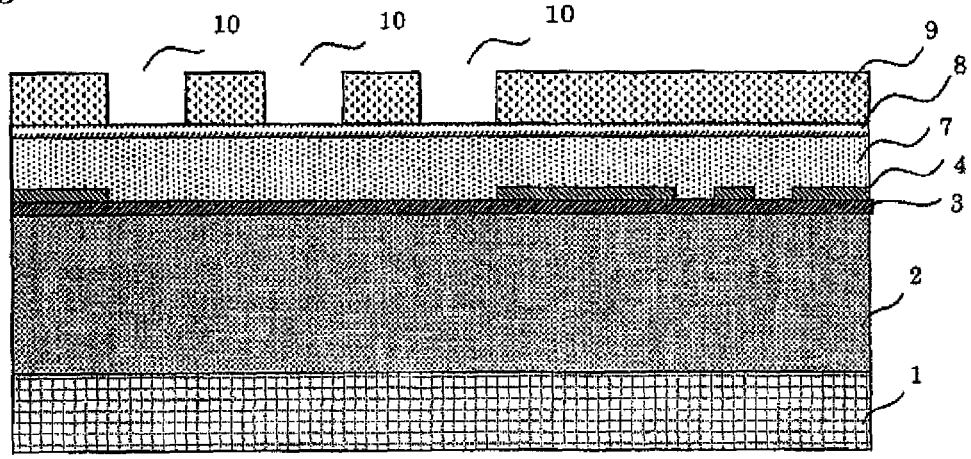
FIG. 2(b) is a cross sectional view taken along the line X-X' of FIG. 2(a)

Next, as illustrated in FIGS. 2(a) and 2(b), there is deposited a multi-layer resist layer formed of three layers, that is, a bottom antireflective coating (BARC) layer 7, a silicon-containing photoresist layer 8, and a conventional photoresist layer 9. Then, opening portions 10 are formed afterward in the conventional photoresist layer 9 using a conventional photolithography technique. Generally, the BARC layer 7 serves a function of controlling a reflection rate of a surface of a base. In addition, the BARC layer 7 is commonly used for the purpose of filling concave portions of the base to planarize the surface thereof and is further used as a mask-function reinforcing material when the base is etched. However, in this embodiment, the BARC layer 7 is used in a subsequent step as a material for forming a core pattern that provides side walls on which side wall spacers are to be formed, and has a thickness of 200 nm. The silicon-containing photoresist layer 8 is originally a layer for reinforcing an endurable level of a photoresist against etching when the photoresist is used as an etching mask, and has a silicon content of 40% and a thickness of 40 nm. The photoresist layer 9 is for argon fluoride (ArF), and is formed by patterning using an ArF immersion exposure apparatus. A line width L (which corresponds, in this embodiment, to an interval between the adjacent opening portions 10) of the photoresist layer is set to 50 nm, and a space S (which corresponds, in this embodiment, to a width of the opening portion 10) thereof is set to 70 nm. Further, the opening portions 10 formed in the photoresist layer 9 are characterized in that both end portions e and f of each of the opening portions 10 in a direction perpendicular to an X-X' direction extend outward beyond both end portions a and c of the opening portion 200 formed in the polycrystalline silicon layer 4. The photoresist layer 9 covers over the positioning monitor mark 5 formed in the polycrystalline silicon layer 4.

Figure 3A:
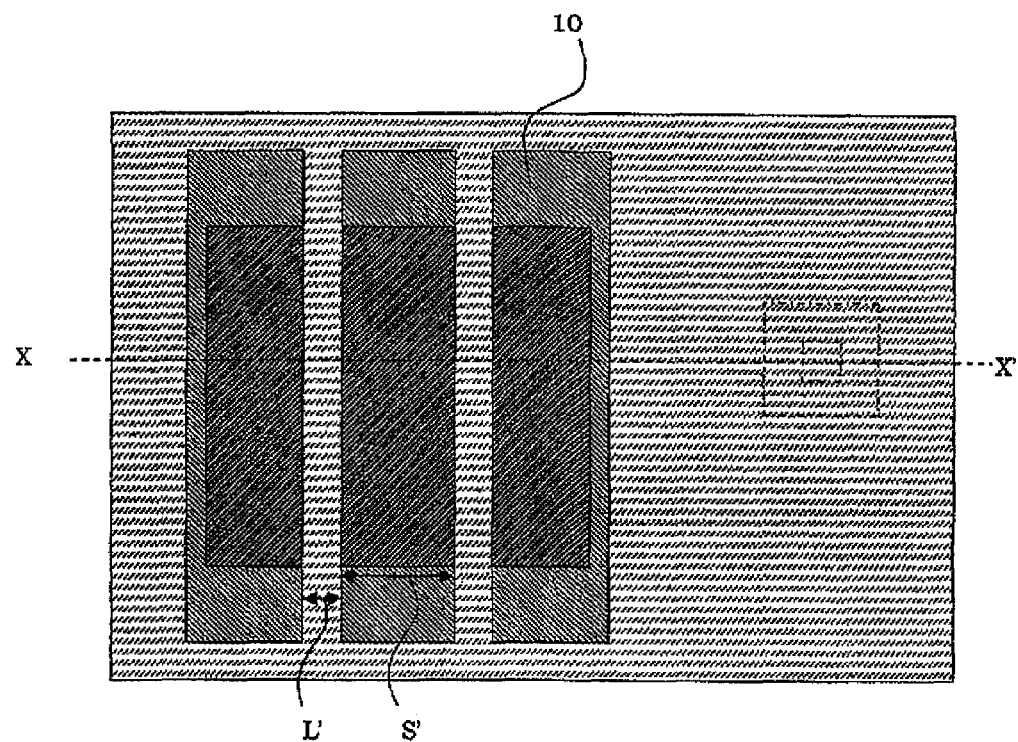
FIG. 3(a) is a plan view.
Figure 3B:
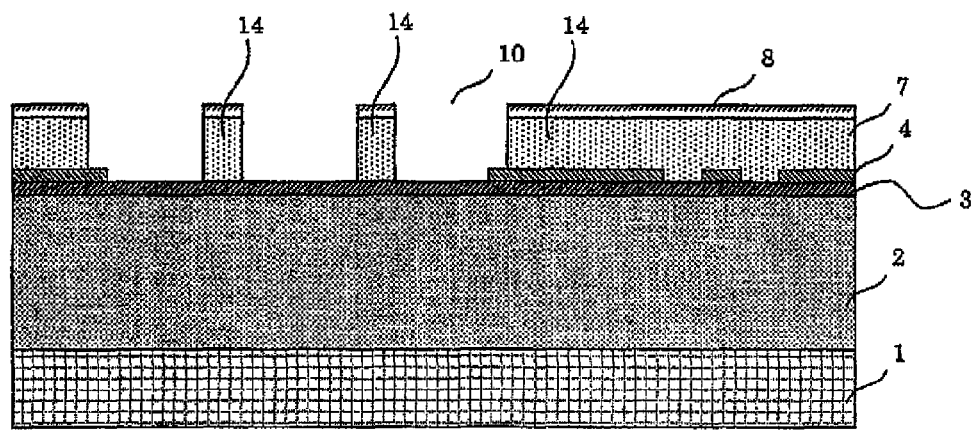
FIG. 3(b) is a cross sectional view taken along the line X-X' of FIG. 3(a)

Next, as illustrated in FIGS. 3(a) and 3(b), the pattern of the opening portions 10 formed in the photoresist layer 9 is transferred by dry etching onto the silicon-containing photoresist layer 8 and the BARC layer 7. Further, side walls of the opening portions 10 formed in the silicon-containing photoresist layer 8 and the BARC layer 7 are caused to uniformly recede by dry etching. In this case, the side walls are caused to recede by 10 nm. As a result, the line width L (which corresponds, in this embodiment, to an interval between the adjacent opening portions 10) of the photoresist layer is changed from 50 nm to a line width L' of 30 nm while the space S (which corresponds, in this embodiment, to a width of the opening portion 10) thereof is changed from 70 nm to a space S' of 90 nm. As described above, a ratio of the line width L' to the space S' is adjusted to be 1 to 3. This is because, when side wall spacers having a thickness of 30 nm are formed in a subsequent step on the inner walls of the opening portions 10 having an opening portion width of 90 nm, an interval between adjacent side wall spacers is made to be 30 nm with the side wall spacers being formed on the inner wall both sides of the opening portion 10.

Figure 4A:
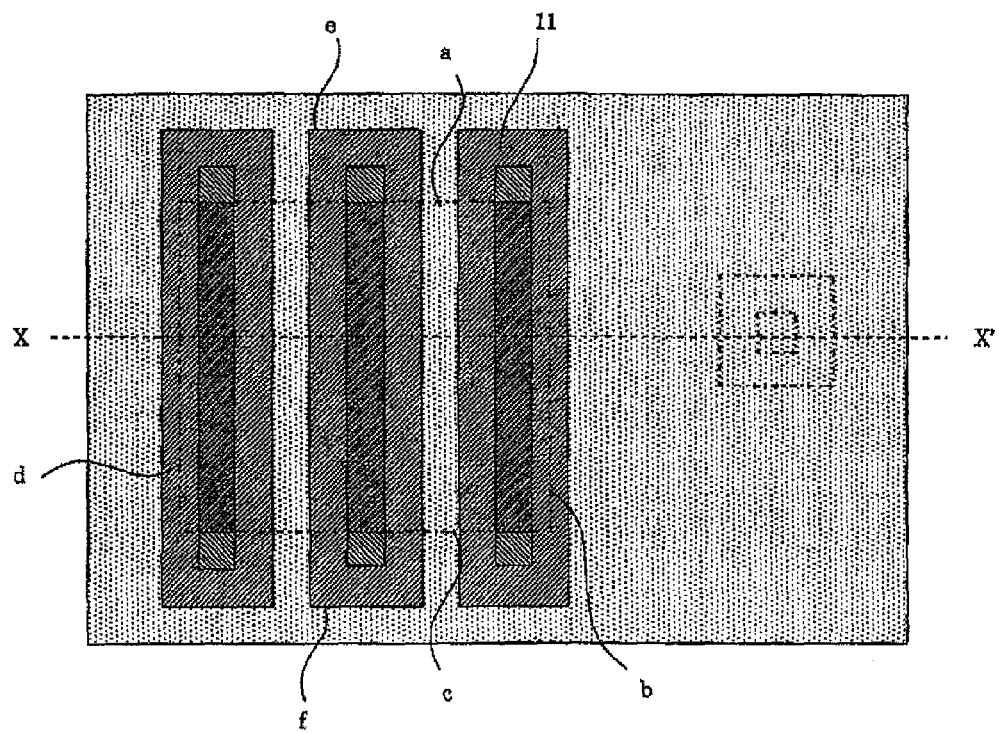
FIG. 4(a) is a plan view.
Figure 4B:
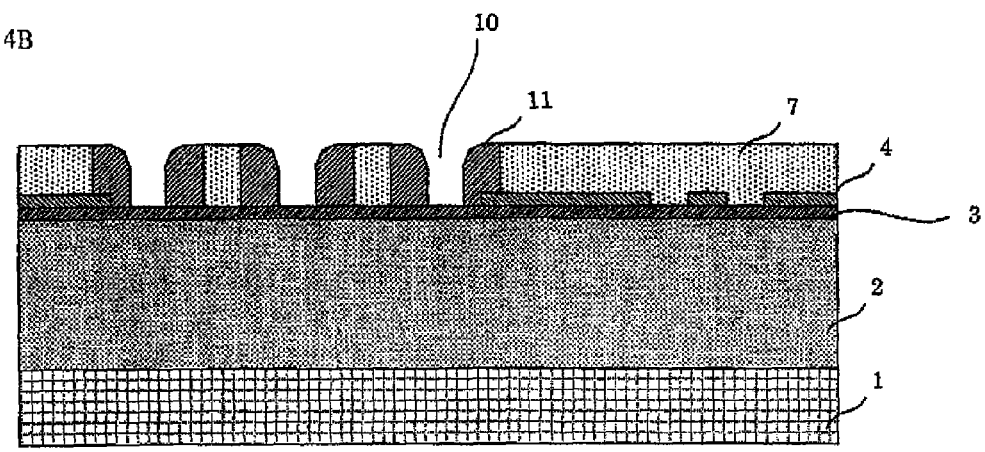
FIG. 4(b) is a cross sectional view taken along the line X-X' of FIG. 4(a)

Next, as illustrated in FIGS. 4(a) and 4(b), conformal films are formed on the silicon-containing photoresist layer 8 and the BARC layer 7 in which the opening portions 10 are formed. The conformal films are etched back, to thereby form side wall spacers 11. In this case, the pattern of an arbitrary size, which is formed in the polycrystalline silicon layer 4, is covered with the silicon-containing photoresist layer 8 and the BARC layer 7, and edge steps of the polycrystalline silicon layer 4 in which the pattern of an arbitrary size is formed are completely planarized by the BARC layer 7. Therefore, the side wall spacer is not formed on side walls of the pattern of an arbitrary size. On the other hand, edges a and c of the rectangular opening portion 200 formed in the polycrystalline silicon layer 4 are partially exposed in the opening portions 10. The thickness of the polycrystalline silicon layer 4 is made sufficiently thin compared with those of the silicon-containing photoresist layer 8 and the BARC layer 7, and the etching back is performed for a sufficiently long length of time. As a result, exposed side wall films formed on side walls of edges of the polycrystalline silicon layer 4 are completely removed, so that the side wall spacer is not formed thereon. Accordingly, the side wall spacers may be formed only on the side walls of the silicon-containing photoresist layer 8 and the BARC layer 7.

In forming the conformal films, in order to prevent the silicon-containing photoresist layer 8 and the BARC layer 7 from being deformed, it is necessary to select a method capable of forming the conformal films at a temperature of 140° C. or lower. For example, a pulsed deposition layer (PDL) is appropriate for this purpose. Tri-methyl aluminum (TMA) as a catalyst is supplied to a surface of a semiconductor wafer, and then, tris(tert-pentoxyl)silanol (TPOS) is supplied to the surface of the semiconductor wafer. As a result, a conformal lamination film, which is formed of $Al_2O_3$ and $SiO_2$ and has a total thickness of 30 nm, is formed because of catalytic reaction.

Figure 5A:
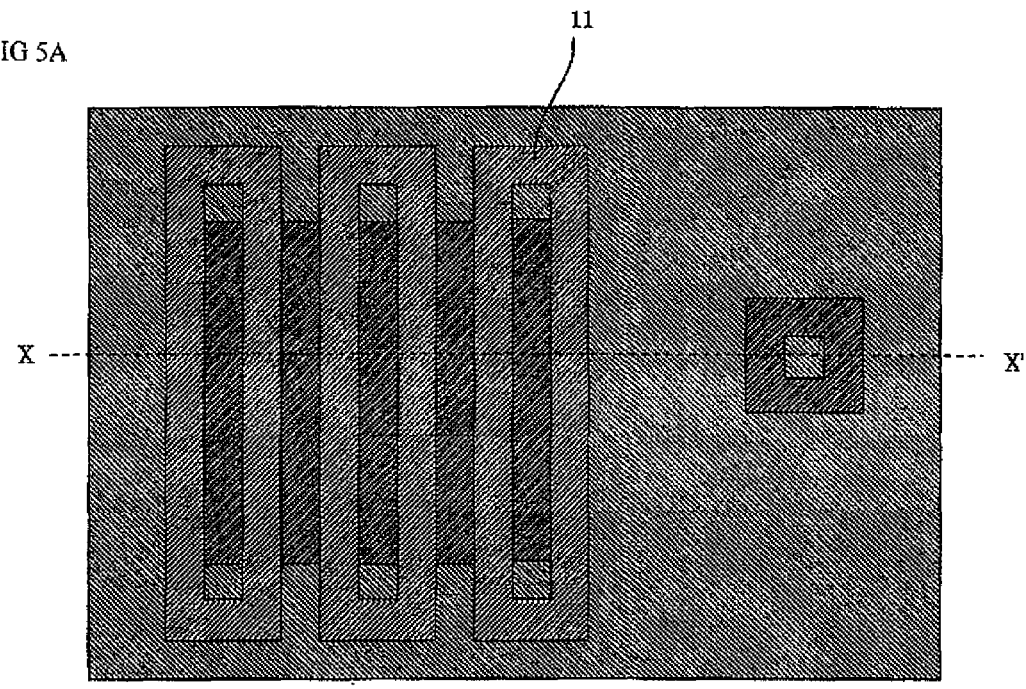
FIG. 5(a) is a plan view.
Figure 5B:
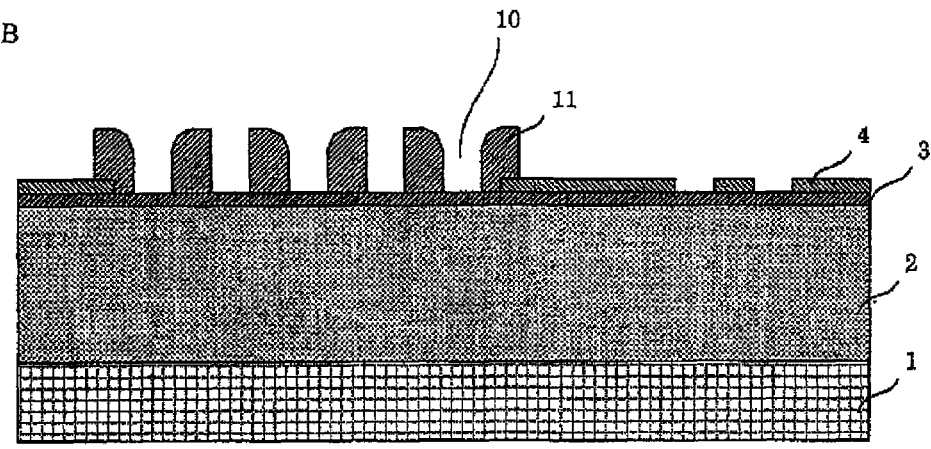
FIG. 5(b) is a cross sectional view taken along the line X-X' of FIG. 5(a)

Next, as illustrated in FIGS. 5(a) and 5(b), the BARC layer 7 is stripped, to thereby complete a hard mask using the side wall spacers 11. With reference to FIG. 5(a), the side wall spacer 11 has a loop-like shape, and extends in part outward beyond a boundary of the rectangular opening portion 200 formed in the polycrystalline silicon layer 4 to overlap with the polycrystalline silicon layer 4.

Figure 6A:
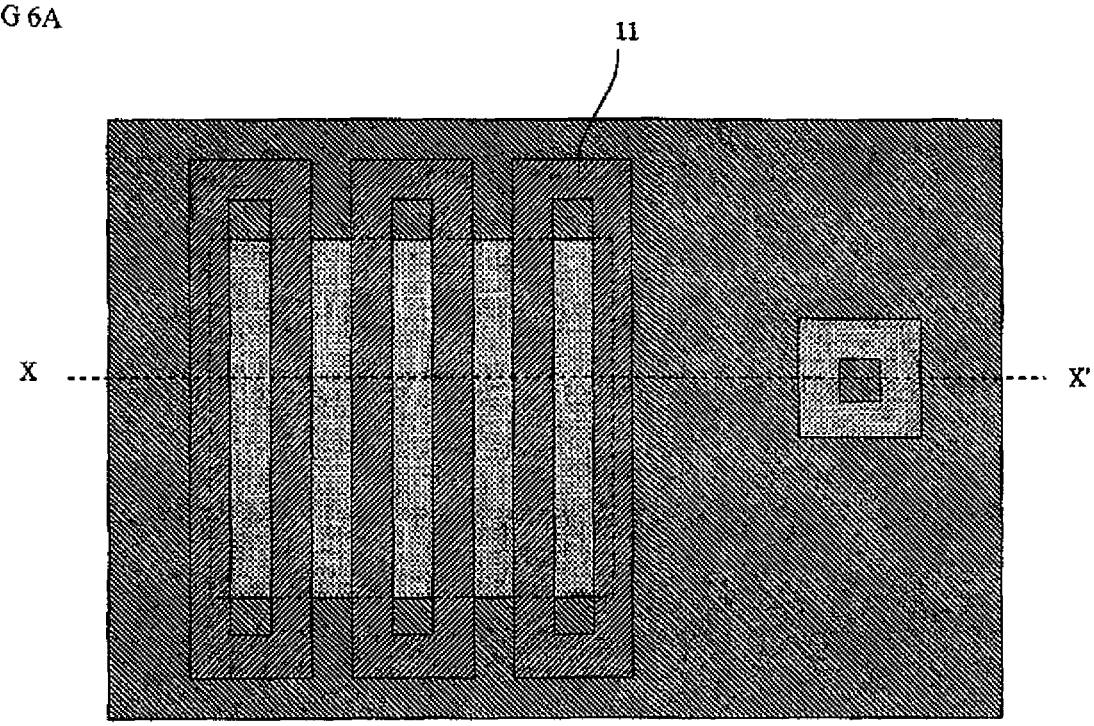
FIG. 6(a) is a plan view.
Figure 6B:
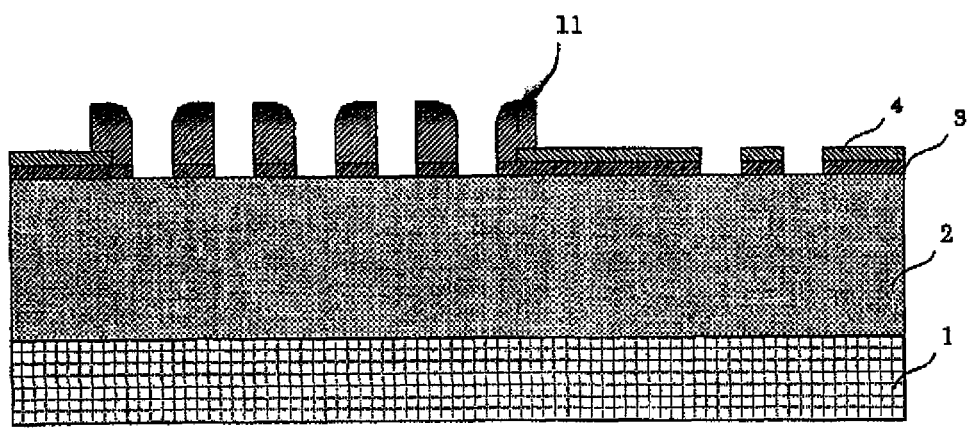
FIG. 6(b) is a cross sectional view taken along the line X-X' of FIG. 6(a)

Next, as illustrated in FIGS. 6(a) and 6(b), the silicon nitride layer 3 is etched using the side wall spacers 11 and the polycrystalline silicon layer 4 as masks. As a result, the pattern formed in the polycrystalline silicon layer 4, which includes the positioning monitor mark 5, and the pattern formed by the side wall spacers 11 may be combined on the silicon nitride layer 3.

Figure 7A:
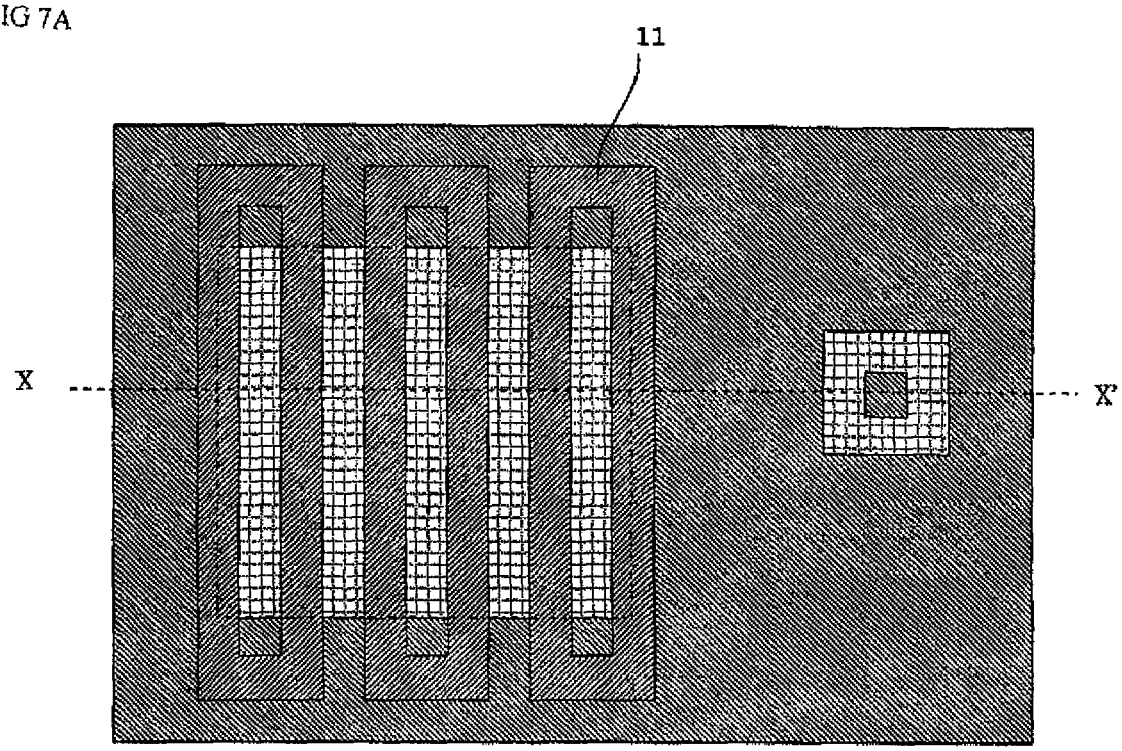
FIG. 7(a) is a plan view.
Figure 7B:
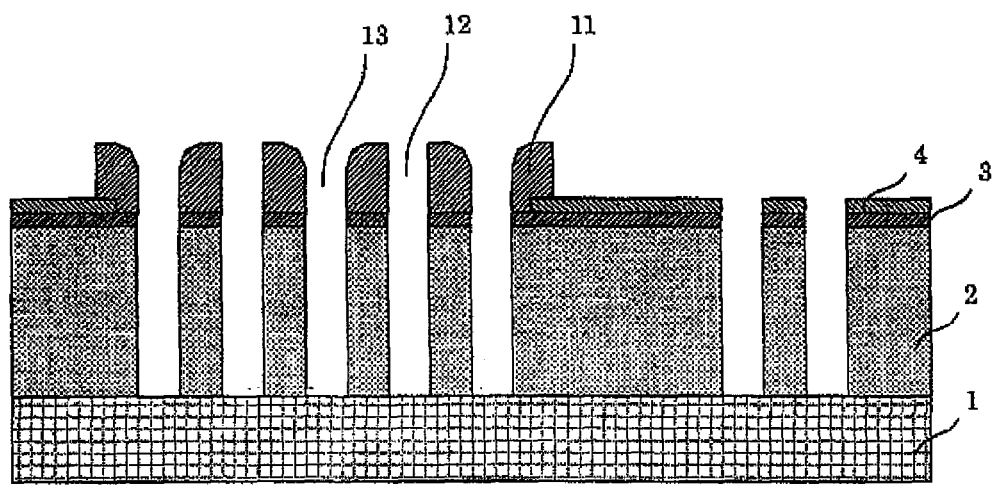
FIG. 7(b) is a cross sectional view taken along the line X-X' of FIG. 7(a)

Next, as illustrated in FIGS. 7(a) and 7(b), the amorphous carbon layer 2 is subsequently etched by dry etching using the side wall spacers 11 and the polycrystalline silicon layer 4 as masks. As a result, the pattern obtained by combining the pattern formed in the polycrystalline silicon layer 4 and the pattern formed by the side wall spacers 11 are transferred onto the amorphous carbon layer 2, to thereby complete a hard mask of the amorphous carbon layer 2. Alternatively, the side wall spacers 11 and the polycrystalline silicon layer 4 may be removed in advance by etching, and then the amorphous carbon layer 2 may be etched using the silicon nitride layer 3 as a mask.

Figure 8A:
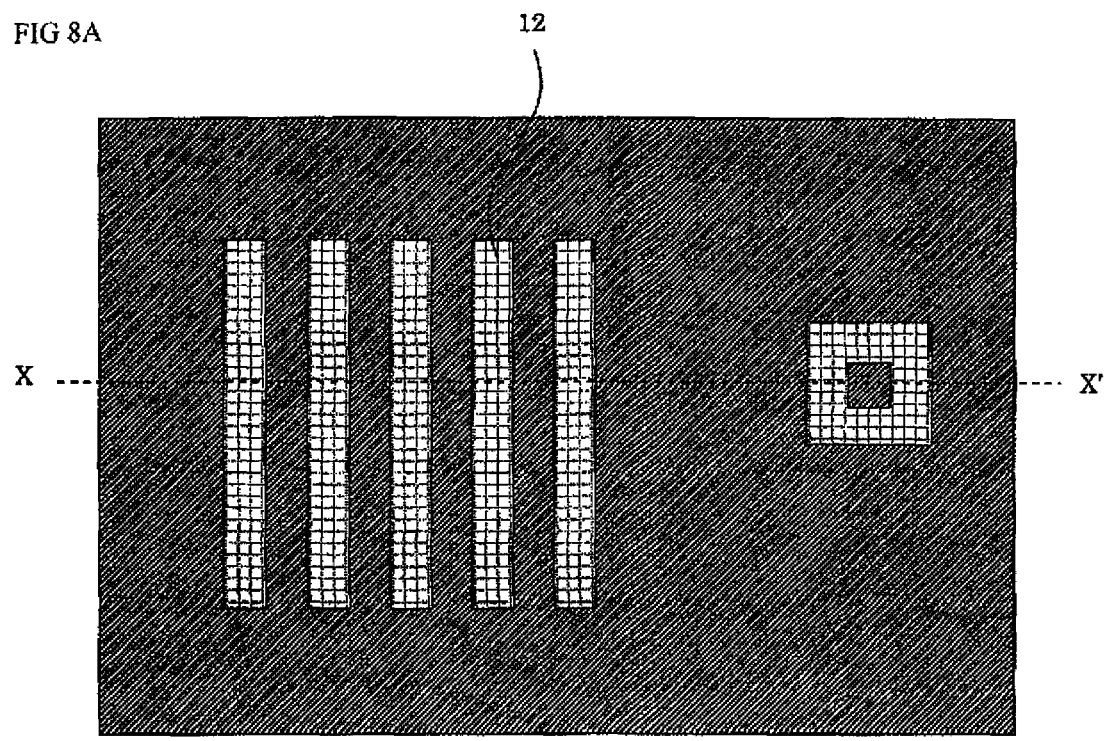
FIG. 8(a) is a plan view.
Figure 8B:
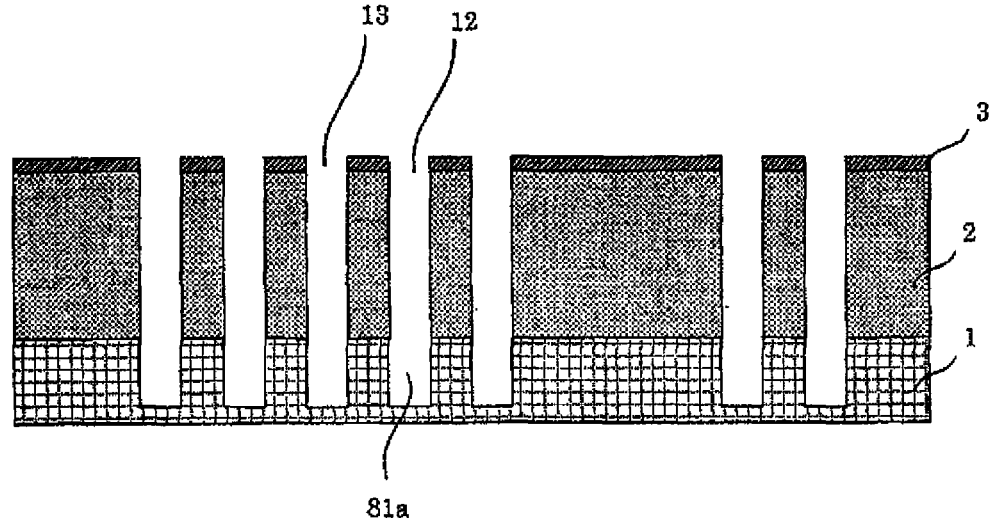
FIG. 8(b) is a cross sectional view taken along the line X-X' of FIG. 8(a)

Next, as illustrated in FIGS. 8(a) and 8(b), the silicon substrate 1 is etched by dry etching using the hard mask of the amorphous carbon layer 2 as a mask, to thereby form isolation trenches 81a of FIG. 39(c).

In this embodiment, a first hard mask is formed in a first hard mask layer in advance. The first hard mask includes: a first pattern that defines opening portions respectively corresponding to a region to be microfabricated and a region in which a pattern of an arbitrary size is to be formed, in a material layer to be processed; and a second pattern that defines another opening portion. The first hard mask forms a first hard mask pattern. Then, at least one opening portion that extends so as to cross the opening portions defined by the first pattern included in the first hard mask is formed in a second layer formed on the first hard mask, and a side wall core that covers the second pattern included in the first hard mask with the second layer is formed. Subsequently, a side wall pattern is formed on side walls of opening portions of the side wall core. After that, a core material that isolates the opening portions of the side wall core from each other and a core material in another region are removed, to thereby form a hard mask formed of the side wall spacers. The material layer is etched using a pattern obtained by combining the first hard mask pattern and the second mask pattern of the side wall spacers, to thereby form the pattern in the material layer. In this manner, there may be avoided a trouble that the side wall spacers are formed on the side walls of the pattern of an arbitrary size, and further, it is not necessary to perform a photolithography step in a state where the hard mask of fine side wall spacers is formed. As a result, a desirable manufacturing process may be obtained.

Second Exemplary Embodiment

Next, a manufacturing process for a semiconductor device according to a second exemplary embodiment is described.

FIGS. 9 to 16 are process views illustrating the manufacturing process for the semiconductor device according to the second exemplary embodiment, particularly, a step of forming a hard mask to process an underlying layer. Here, the step of forming the metal plug openings 101 included in the manufacturing process for the PRAM described above as an example is described. FIGS. 9(a), 10(a), 11(a), 12(a), 13(a), 14(a), 15(a), and 16(a) are plan views, and FIGS. 9(b), 10(b), 11(b), 12(b), 13(b), 14(b), 15(b), and 16(b) are cross sectional views respectively taken along the lines X-X' of FIGS. 9(a), 10(a), 11(a), 12(a), 13(a), 14(a), 15(a), and 16(a).

With reference to these figures, the following case is described. There are schematically arranged: a pattern in which five×four fine opening patterns (light pattern portions), which are formed using side wall spacers as a hard mask, are arranged at a pitch of 60 nm, in a microfabrication region 26 typified by the memory cell array region; and a positioning monitor mark 25 serving as an example of a pattern of an arbitrary size in a region other than the microfabrication region 26. A region other than the microfabrication region 26 and other than a region in which the positioning monitor mark 25 is formed, corresponds to the dark pattern portion.

Figure 9A:
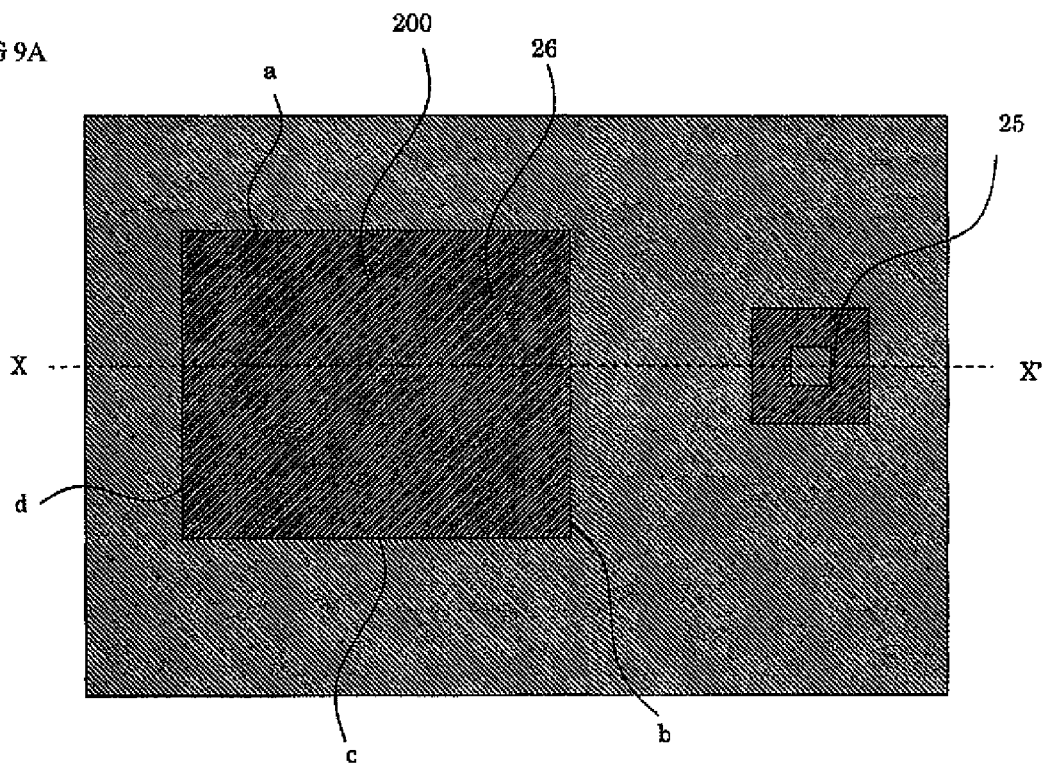
FIG. 9(a) is a plan view.
Figure 9B:
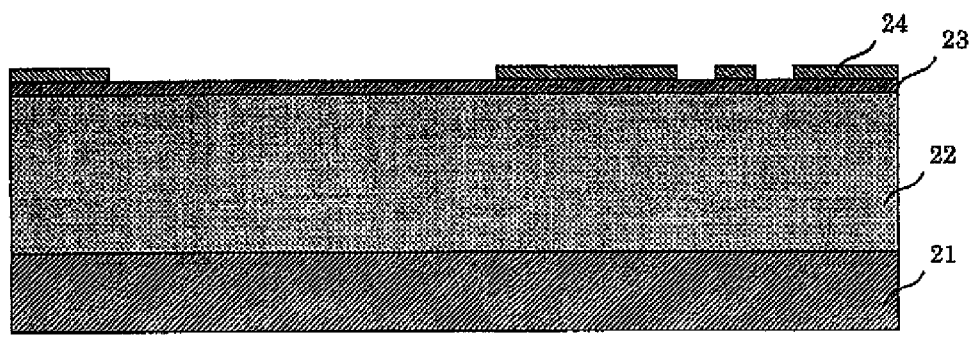
FIG. 9(b) is a cross sectional view taken along the line X-X' of FIG. 9(a)

With reference to FIGS. 9(a) to 9(b), an amorphous carbon layer 22, a silicon nitride layer 23, and a polycrystalline silicon layer 24 are sequentially deposited on an insulating layer being a material to be processed, for example, a silicon oxide layer 21. The amorphous carbon layer 22 serves as a material of a hard mask when the silicon oxide layer 21 is etched. The silicon nitride layer 23 serves as a material of a hard mask used for forming a pattern in the amorphous carbon layer 22. The polycrystalline silicon layer 24 also serves as a material of a hard mask. Then, the polycrystalline silicon layer 24 is processed using a conventional photolithography technique, to thereby form by patterning the rectangular opening portion 200 surrounded by outlines a, b, c, and d correspondingly to the microfabrication region 26 and the positioning monitor mark 25 correspondingly to the region other than the microfabrication region 26. This step is similar to that of the first exemplary embodiment, and hence a description thereof is omitted.

Figure 10A:
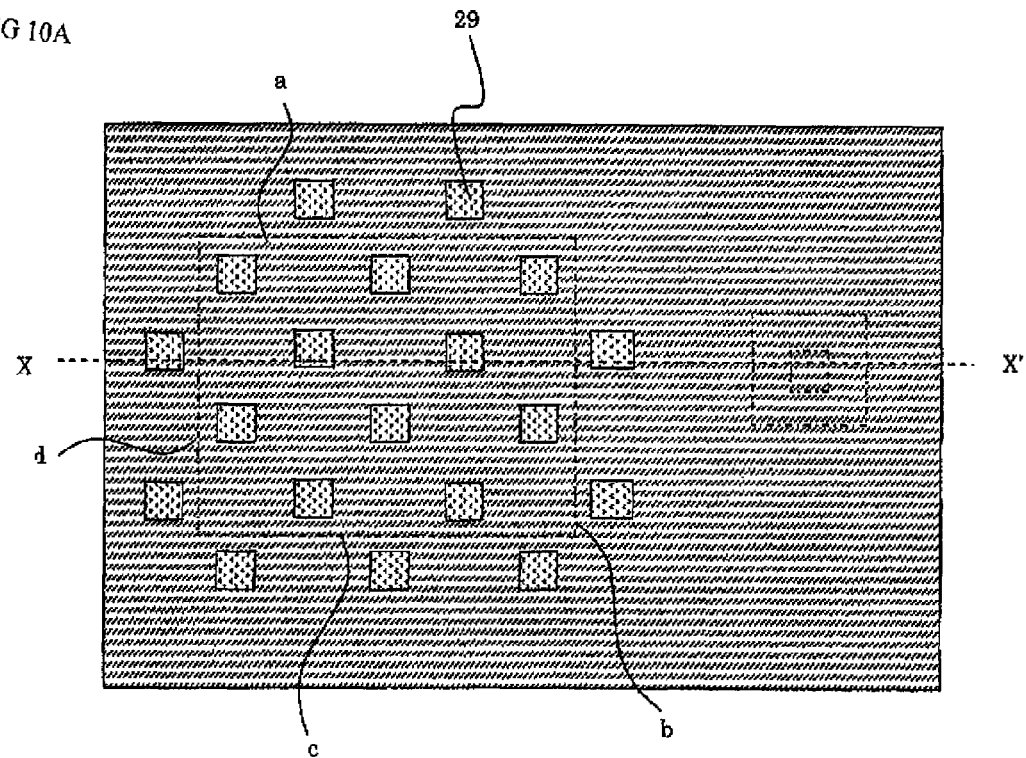
FIG. 10(a) is a plan view.
Figure 10B:
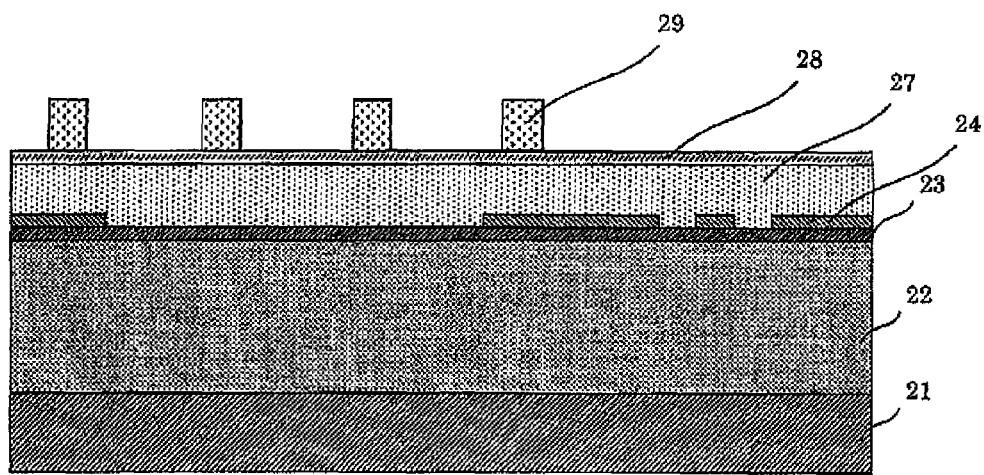
FIG. 10(b) is a cross sectional view taken along the line X-X' of FIG. 10(a)

Next, as illustrated in FIGS. 10(a) and 10(b), there is deposited a multi-layer resist layer formed of three layers, that is, a bottom antireflective coating (BARC) layer 27, a silicon-containing photoresist layer 28, and a conventional photoresist layer 29. Then, a resist pattern for forming a core pattern for a side wall spacer formation is formed in the conventional photoresist layer 29 using a conventional photolithography technique.

As illustrated in FIGS. 10(a) and 10(b), the core pattern is formed of islands that are regularly arranged in two-dimensional directions at predetermined pitches. More specifically, in this embodiment, the islands are arranged at pitches of equal distance in oblique directions of ±45° with respect to a horizontal line. On the other hand, pitches of the islands in a row direction (horizontal direction) and a column direction are set to be $\sqrt{2}$ times the pitches thereof in the oblique directions of ±45°. Further, dummy islands that are not to form an opening portion in the end are arranged outside the opening portion 200. The dummy islands may be provided in order to form opening portions located at an outermost periphery of a desired opening portion arrangement.

Figure 11A:
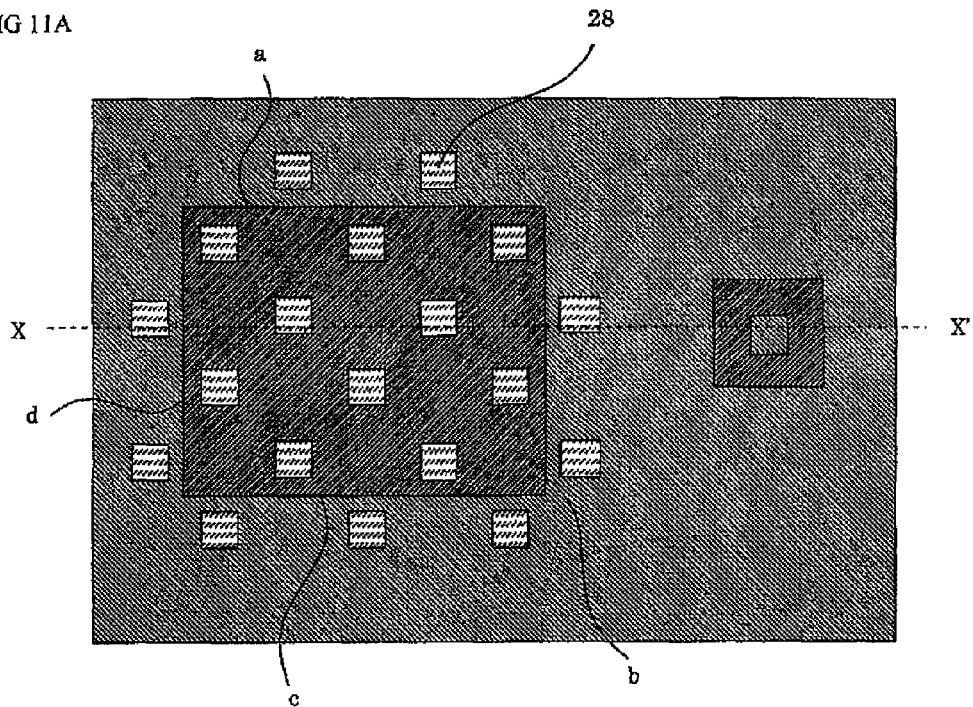
FIG. 11(a) is a plan view.
Figure 11B:
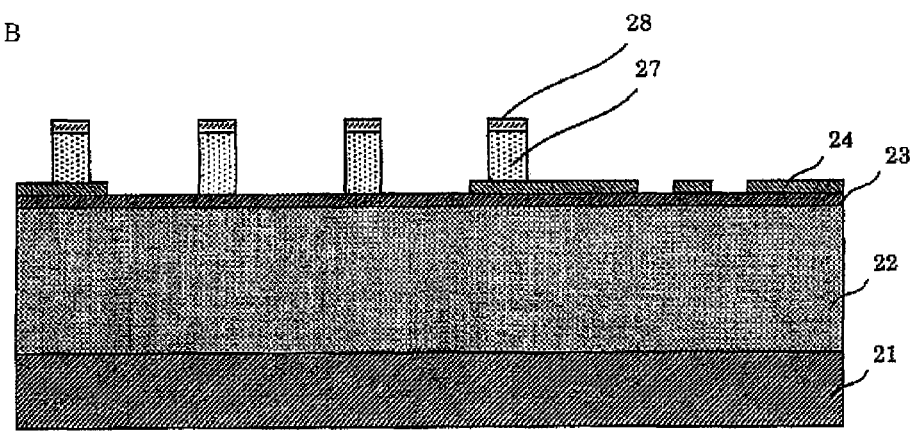
FIG. 11(b) is a cross sectional view taken along the line X-X' of FIG. 11(a)

Next, as illustrated in FIGS. 11(a) and 11(b), after the pattern formed in the photoresist layer 29 is transferred by dry etching onto the silicon-containing photoresist layer 28 and the BARC layer 27, side walls of the core patterns formed in the silicon-containing photoresist layer 8 and the BARC layer 27 are caused to uniformly recede by dry etching, to thereby form the core pattern in a desired size.

Figure 12A:
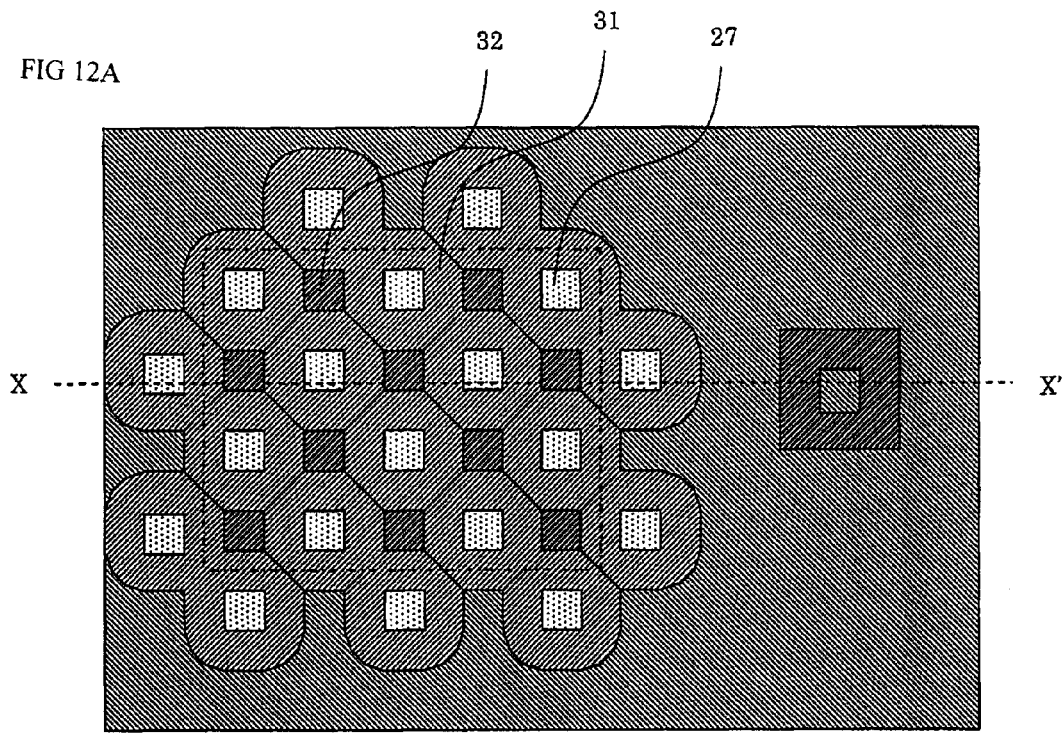
FIG. 12(a) is a plan view.
Figure 12B:
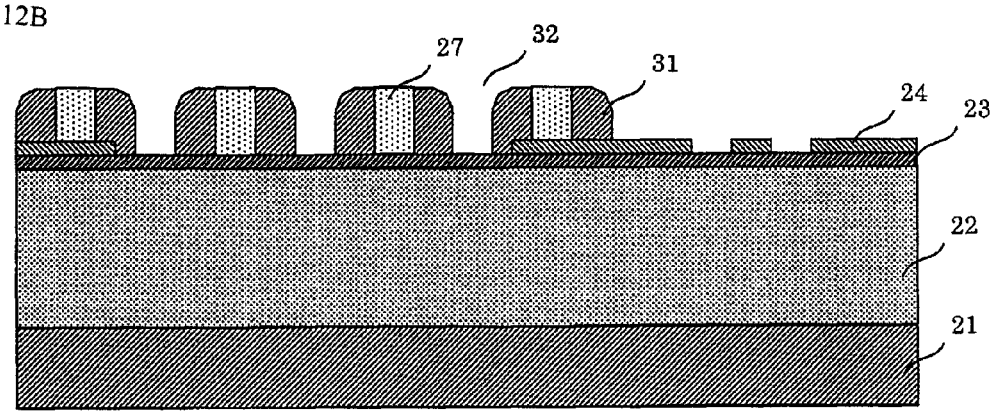
FIG. 12(b) is a cross sectional view taken along the line X-X' of FIG. 12(a)

Next, as illustrated in FIGS. 12(a) and 12(b), conformal films are formed on the core pattern formed of the silicon-containing photoresist layer 28 and the BARC layer 27. The conformal films are etched back, to thereby form side wall spacers 31. Similarly to the first exemplary embodiment, the pulsed deposition layer (PDL) is adopted, and the side wall spacers 31 formed of a lamination film of $Al_2O_3$ and $SiO_2$ is obtained. Most adjacent islands in the core pattern are located in the oblique directions of ±45°. The thickness of the respective side wall spacers 31 is set such that the side wall spacers 31 of the most adjacent islands are in contact with each other. As a result, the side wall spacers 31 in the core pattern are not in contact with each other in the row direction and in the column direction, to thereby form spaces 32 therebetween. Moreover, the thickness of the respective side wall spacers 31 is adjusted such that a size of the respective spaces 32 is a desired opening portion size.

Figure 13A:
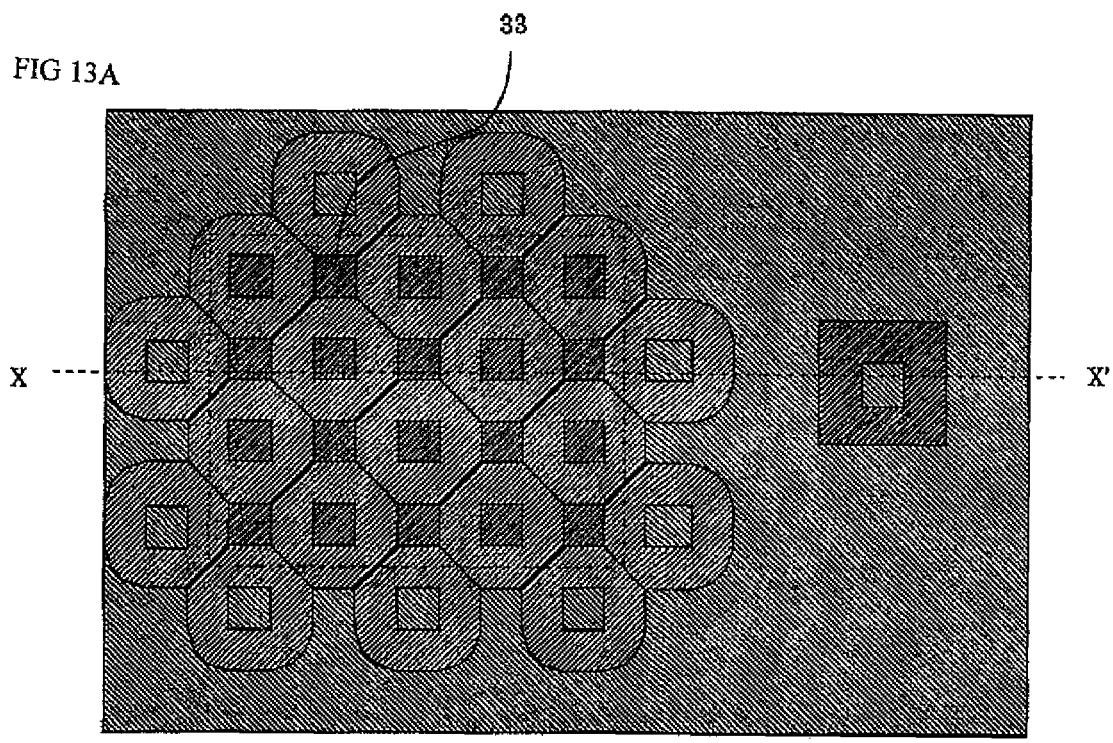
FIG. 13(a) is a plan view.
Figure 13B:
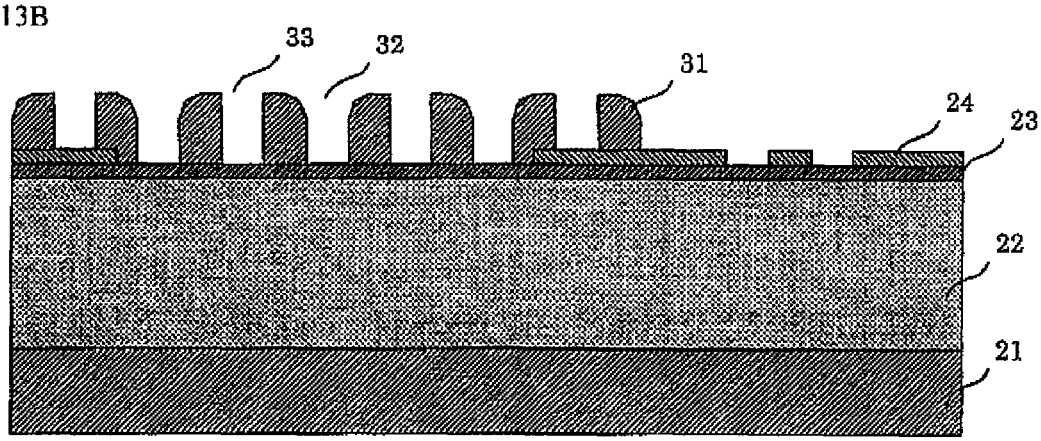
FIG. 13(b) is a cross sectional view taken along the line X-X' of FIG. 13(a)

Next, as illustrated in FIGS. 13(a) and 13(b), the BARC layer 27 is stripped, to thereby complete a hard mask using the side wall spacers 31. There is formed an array of 5×4 opening portions including openings 33 and openings 32 that are arranged respectively at locations 33 in which the core pattern for a side wall spacer 31 formation was formed and at the spaces 32 between the side wall spacers 31.

Figure 14A:
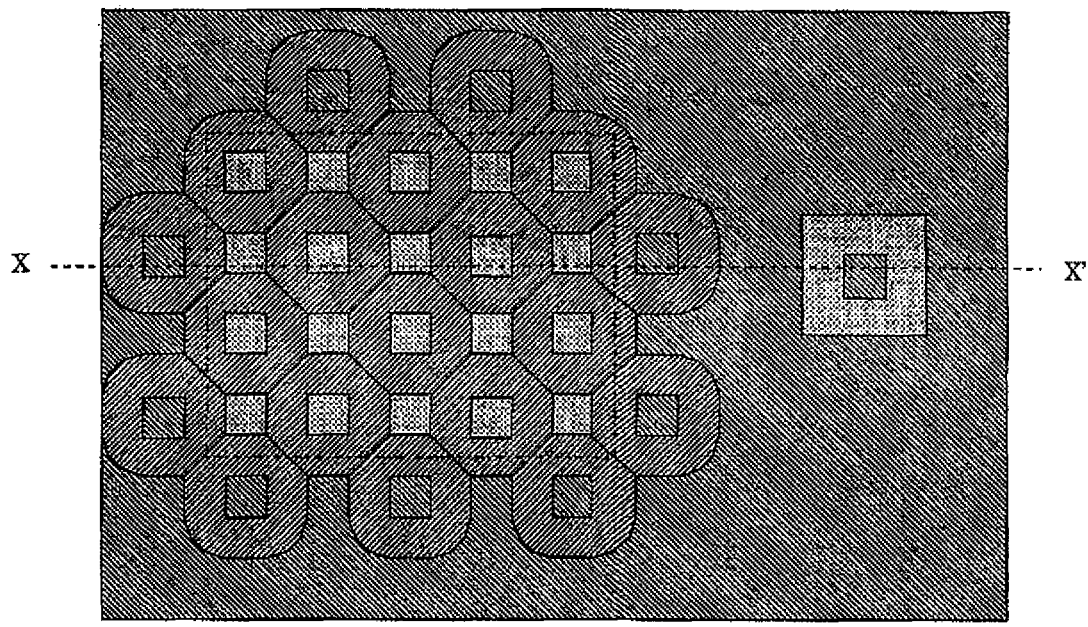
FIG. 14(a) is a plan view.
Figure 14B:
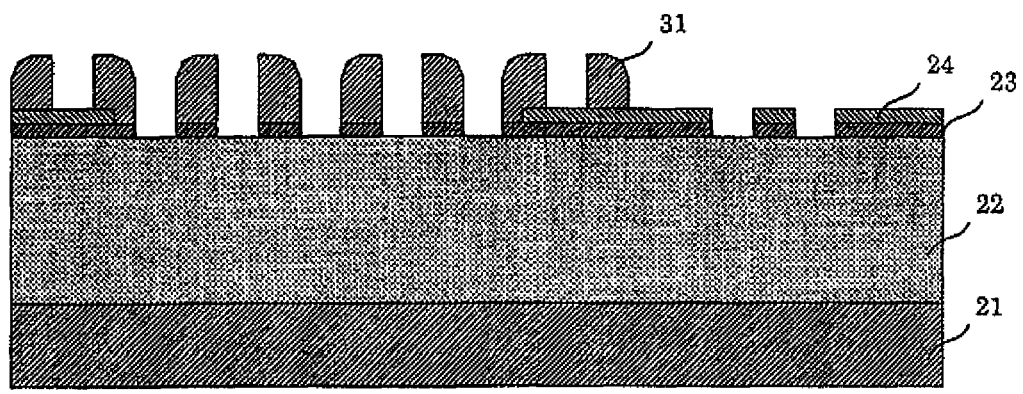
FIG. 14(b) is a cross sectional view taken along the line X-X' of FIG. 14(a)

Next, as illustrated in FIGS. 14(a) and 14(b), the silicon nitride layer 23 is etched using the side wall spacers 31 and the polycrystalline silicon layer 24 as masks. As a result, the pattern formed in the polycrystalline silicon layer 24, which includes the positioning monitor mark 25, and the pattern formed by the side wall spacers 31 may be combined on the silicon nitride layer 23. The core pattern for dummies provided for forming a pattern of opening portions located outermost in the opening portion array pattern is not transferred onto the silicon nitride layer 23 because the core pattern for dummies are located on the polycrystalline silicon layer 24.

Figure 15A:
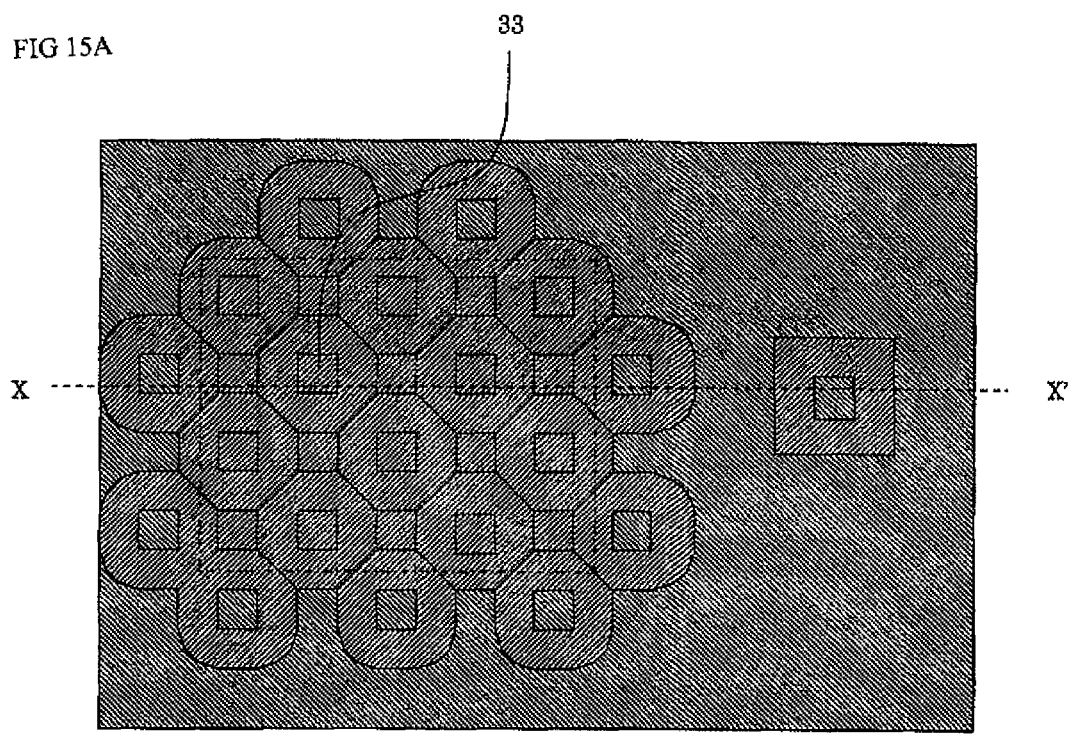
FIG. 15(a) is a plan view.
Figure 15B:
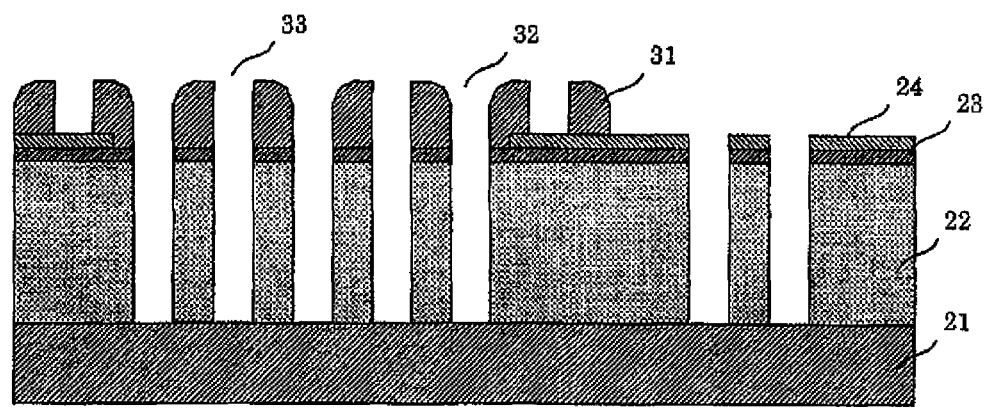
FIG. 15(b) is a cross sectional view taken along the line X-X' of FIG. 15(a)

Next, as illustrated in FIGS. 15(a) and 15(b), the amorphous carbon layer 22 is subsequently etched by dry etching using the side wall spacers 31 and the polycrystalline silicon layer 24 as masks. As a result, a pattern obtained by combining the pattern formed in the polycrystalline silicon layer 24 and the pattern formed by the side wall spacers 31 are transferred onto the amorphous carbon layer 22, to thereby complete a hard mask of the amorphous carbon layer 22. Alternatively, after the side wall spacers 31 and the polycrystalline silicon layer 24 are removed by etching, the amorphous carbon layer 22 may be etched using the silicon nitride layer 23 as a mask.

Figure 16A:
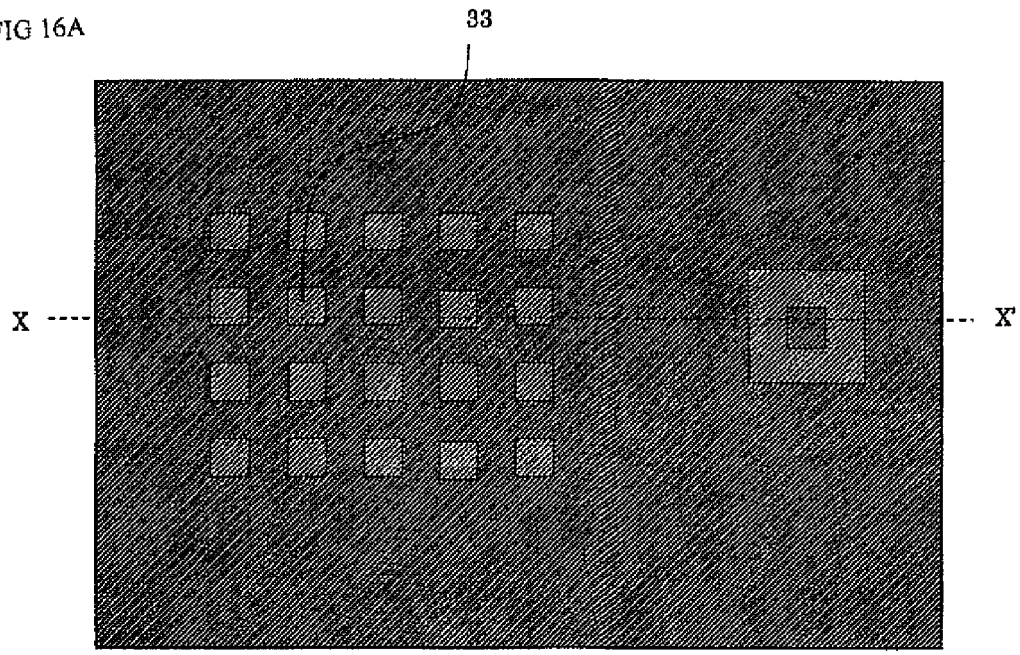
FIG. 16(a) is a plan view.
Figure 16B:
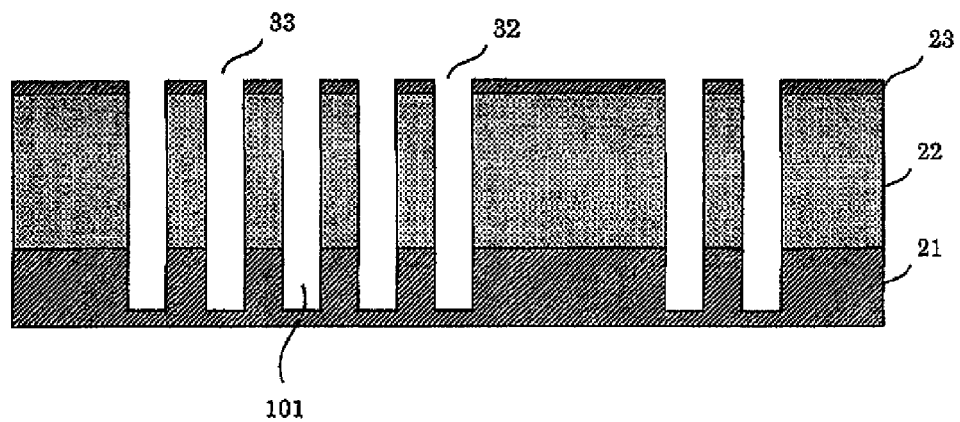
FIG. 16(b) is a cross sectional view taken along the line X-X' of FIG. 16(a)

Next, as illustrated in FIGS. 16(a) and 16(b), the silicon oxide layer 21 is etched by dry etching using the hard mask of the amorphous carbon layer 22 as a mask, to thereby form the openings 101 for the metal plug of FIG. 41.

In this embodiment, a first hard mask is formed in a first hard mask layer in advance. The first hard mask includes: a first pattern that defines opening portions respectively corresponding to a region to be microfabricated and a region in which a pattern of an arbitrary size is to be formed, in a material layer to be processed; and a second pattern that is defined by another opening portion. The first hard mask forms a first hard mask pattern. After that, a side wall core including a core pattern is formed in a second layer formed on the first hard mask. The side wall core has a regular arrangement of islands in the opening portion that defines the microfabrication region, of the first hard mask pattern. As a preferable regular arrangement of the islands, first arrays and second arrays are alternately arranged with an interval therebetween in the opening portion that defines the microfabrication region. The first array includes a plurality of islands arranged at a predetermined pitch in one direction. The second array is arranged in parallel to the first array and is shifted by half the pitch of the islands included in the first array. The first arrays and the second arrays are each alternatively arranged to have an interval equal to half the pitch of the islands included in the first array.

The forming the side wall spacers includes forming side wall films on side walls of the islands of the side wall core, and then etching the side wall films such that the member to be etched is exposed at portions between adjacent islands.

The removing by etching the side wall core includes forming the side wall spacers by exposing the member to be etched at locations in which the islands of the side wall core were formed and at the portions between the adjacent islands, to thereby form the side wall spacers.

A combined pattern by using the first hard mask and the side wall spacers as a mask is formed in the material layer to be processed.

In this manner, there may be avoided a trouble that the side wall spacers are formed on the side walls of the pattern of an arbitrary size, and further, it is not necessary to perform a photolithography step in a state where the hard mask of fine side wall spacers is formed. As a result, a desirable manufacturing process may be obtained.

Third Exemplary Embodiment

Next, a manufacturing process for a semiconductor device according to a third exemplary embodiment is described.

FIGS. 17 to 27 are views illustrating the manufacturing process for the semiconductor device according to the third exemplary embodiment, particularly, steps of forming a hard mask to process an underlying layer. FIGS. 17(a), 18(a), 19(a), 20(a), 21(a), 22(a), 23(a), 24(a), 25(a), 26(a), and 27(a) are plan views, and FIGS. 17(b), 18(b), 19(b), 20(b), 21(b), 22(b), 23(b), 24(b), 25(b), 26(b), and 27(b) are cross sectional views respectively taken along the lines X-X' of FIGS. 17(a), 18(a), 19(a), 20(a), 21(a), 22(a), 23(a), 24(a), 25(a), 26(a), and 27(a).

With reference to the figures, the following case is described. There are schematically arranged: a pattern in which five line patterns (dark pattern portions), which are formed using side wall spacers as a hard mask, are arranged in a microfabrication region 46 typified by the memory cell array region; and island-like patterns (dark pattern portions) each serving as an example of a pattern of an arbitrary size in a region other than the microfabrication region 46. Another region other than the microfabrication region 46 and other than a region in which the island-like patterns are formed is a light pattern portion.

Figure 17A:
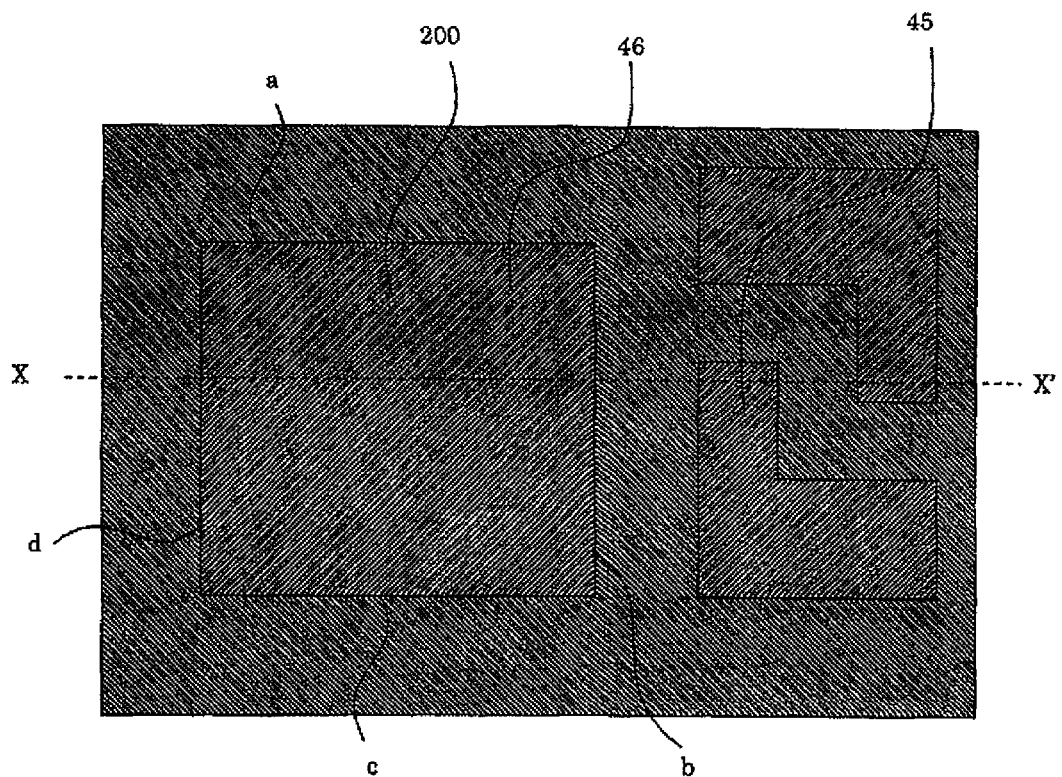
FIG. 17(a) is a plan view.
Figure 17B:
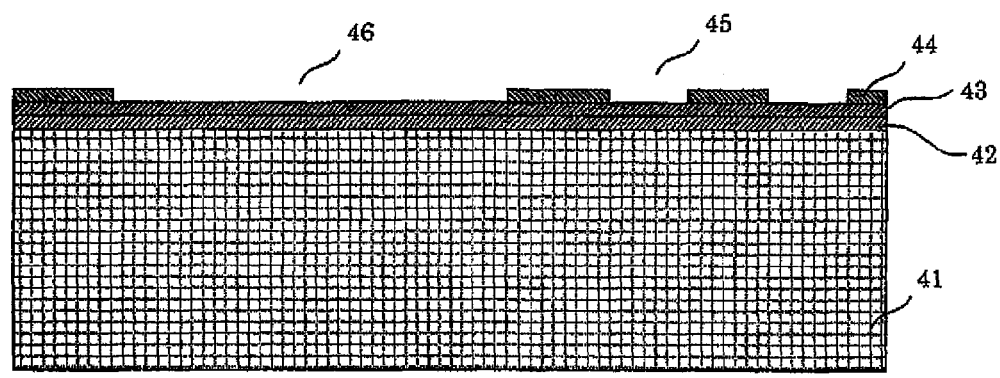
FIG. 17(b) is a cross sectional view taken along the line X-X' of FIG. 17(a)

As illustrated in FIGS. 17(a) and 17(b), a silicon oxide layer 42, a silicon nitride layer 43, and a titanium nitride layer 44 are sequentially deposited on a silicon substrate 41 being a material to be processed. The silicon oxide layer 42 is to become a material of a hard mask when the silicon substrate 41 is etched. The silicon nitride layer 43 is to become a material of a hard mask used for forming a pattern in the silicon oxide layer 42. The titanium nitride layer 44 is to become also a material of a hard mask. Then, the titanium nitride layer 44 is processed using a conventional photolithography technique, to thereby form by patterning an opening portion in the microfabrication region 46 and reverse patterns 45 of the island-like patterns in the region other than the microfabrication region 46. In the microfabrication region 46 in which the opening portion is formed, a hard mask pattern of a size smaller than a resolution limit of lithography is formed using the side wall spacers as a hard mask in subsequent steps. On the other hand, each of the reverse patterns 45 of the island-like patterns is the example of the pattern of an arbitrary size, and may be formed as the pattern of an arbitrary size without limitation due to a pattern width of the hard mask of the side wall spacers. Further, the titanium nitride layer 44 is formed to cover the underlying layer (in this case, silicon nitride layer 43) in the region other than the microfabrication region 46 and other than the part in which the pattern of an arbitrary size is formed.

Figure 18A:
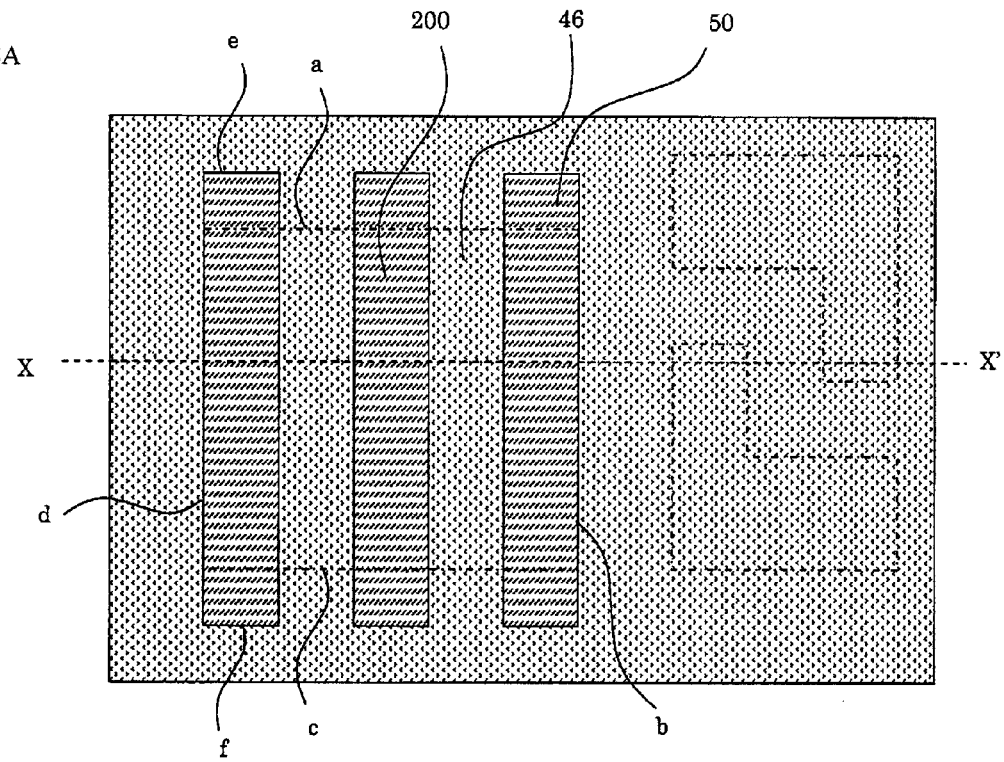
FIG. 18(a) is a plan view.
Figure 18B:
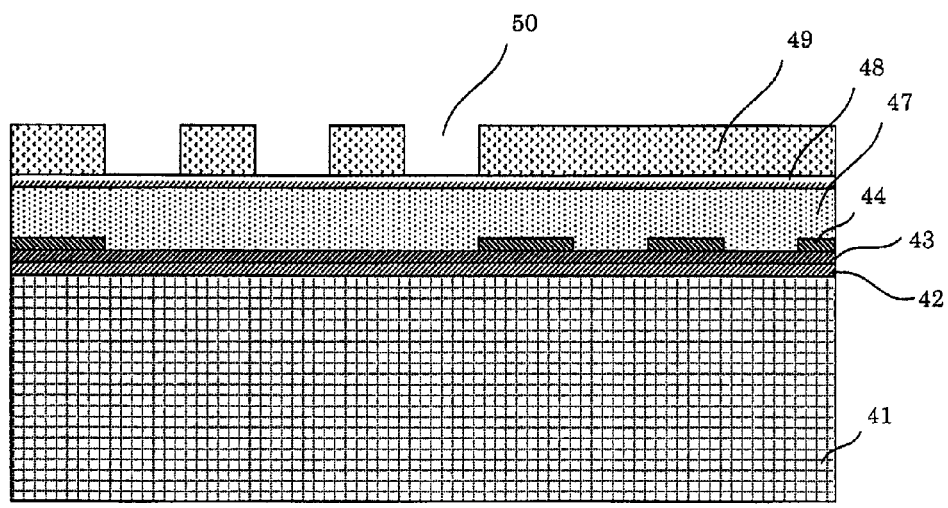
FIG. 18(b) is a cross sectional view taken along the line X-X' of FIG. 18(a)

Next, as illustrated in FIGS. 18(a) and 18(b), there is deposited a multi-layer resist layer formed of three layers, that is, a bottom antireflective coating (BARC) layer 47, a silicon-containing photoresist layer 48, and a conventional photoresist layer 49. Then, opening portions 50 are formed in the conventional photoresist layer 49 using a conventional photolithography technique. A line width (here, interval between adjacent opening portions 50) of the photoresist layer is set to 50 nm, and a space (here, width of opening portion 50) thereof is set to 70 nm. Both end portions e and f of the opening portion 50 formed in the conventional photoresist layer 49 extend outwardly with respect to both end portions a and c of the opening portion 200 formed in the titanium nitride layer 44. The conventional photoresist layer 49 covers the reverse patterns 45 of the island-like patterns formed in the titanium nitride layer 44.

Figure 19A:
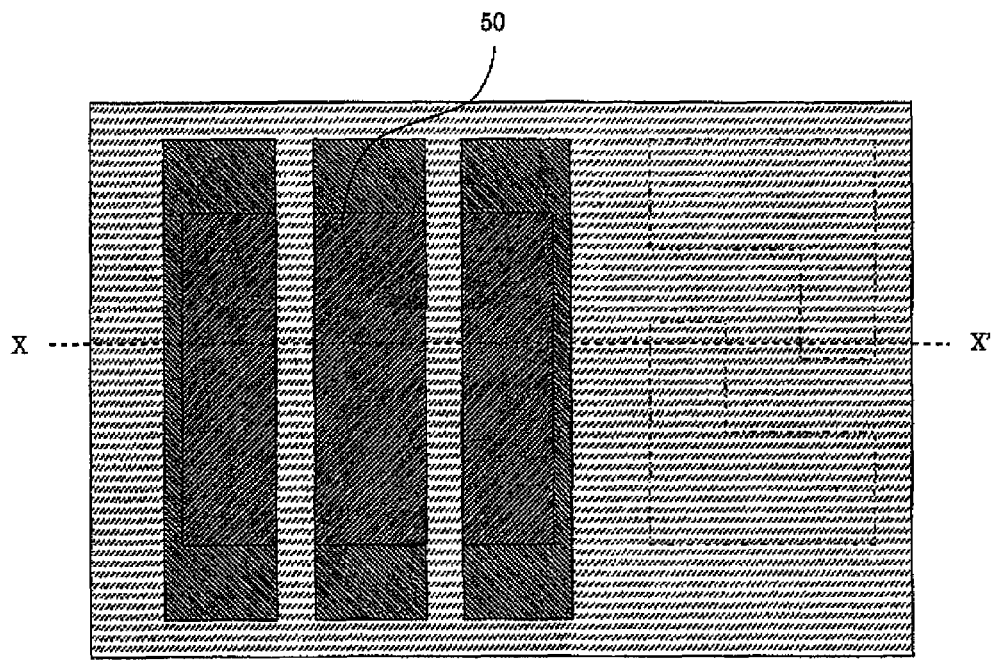
FIG. 19(a) is a plan view.
Figure 19B:
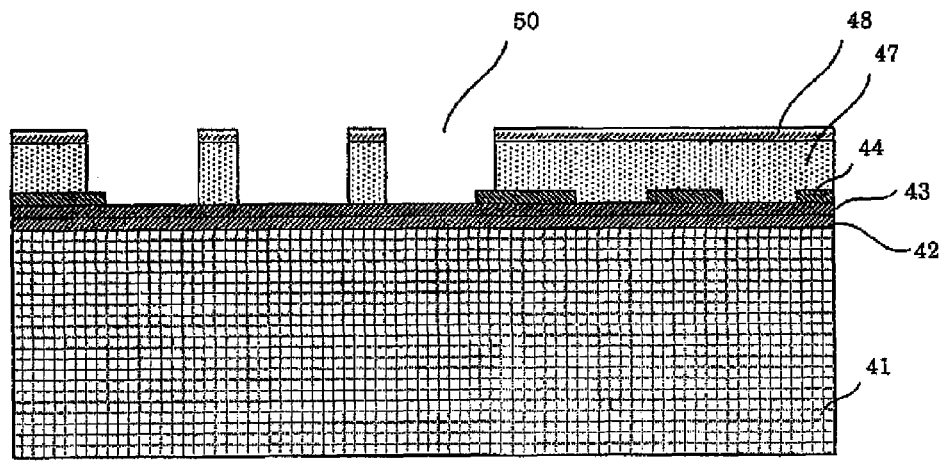
FIG. 19(b) is a cross sectional view taken along the line X-X' of FIG. 19(a)

Next, as illustrated in FIGS. 19(a) and 19(b), the pattern of the opening portions 50 formed in the conventional photoresist layer 49 is transferred by dry etching onto the silicon-containing photoresist layer 48 and the BARC layer 47. Further, side walls of the opening portions 50 formed in the silicon-containing photoresist layer 48 and the BARC layer 47 are caused to uniformly recede by dry etching. In this case, the side walls are caused to recede by 50 nm. As a result, the line width (here, interval between adjacent opening portions 50) of the photoresist layer is changed from 50 nm to a line width of 30 nm while the space (here, width of opening portion 50) thereof is changed from 70 nm to a space of 90 nm.

Figure 20A:
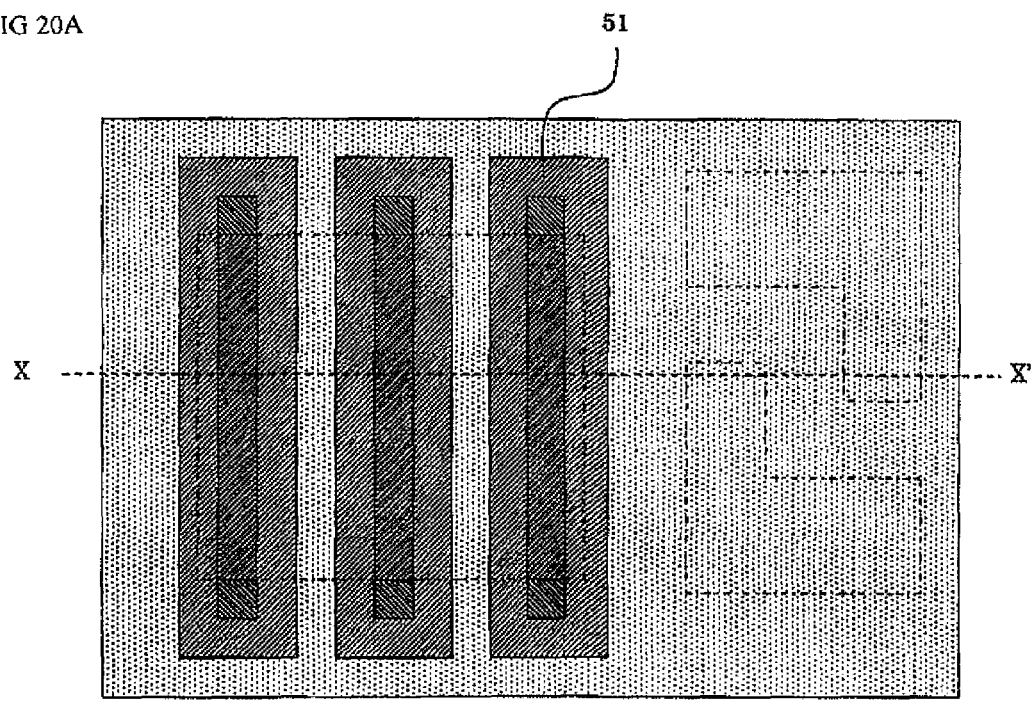
FIG. 20(a) is a plan view.
Figure 20B:
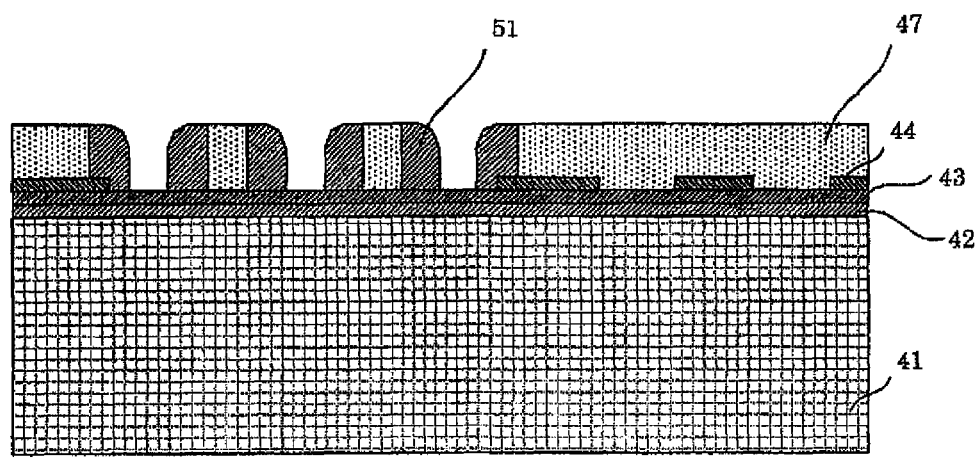
FIG. 20(b) is a cross sectional view taken along the line X-X' of FIG. 20(a)

Next, as illustrated in FIGS. 20(a) and 20(b), conformal films are formed on the silicon-containing photoresist layer 48 and the BARC layer 47 in which the opening portions 50 are formed. The conformal films are etched back, to thereby form side wall spacers 51. Similarly, the pulsed deposition layer (PDL) is adopted, and the side wall spacers 51, which are formed of a lamination film of $Al_2O_3$ and $SiO_2$ with a total thickness of 30 nm, are obtained.

Figure 21A:
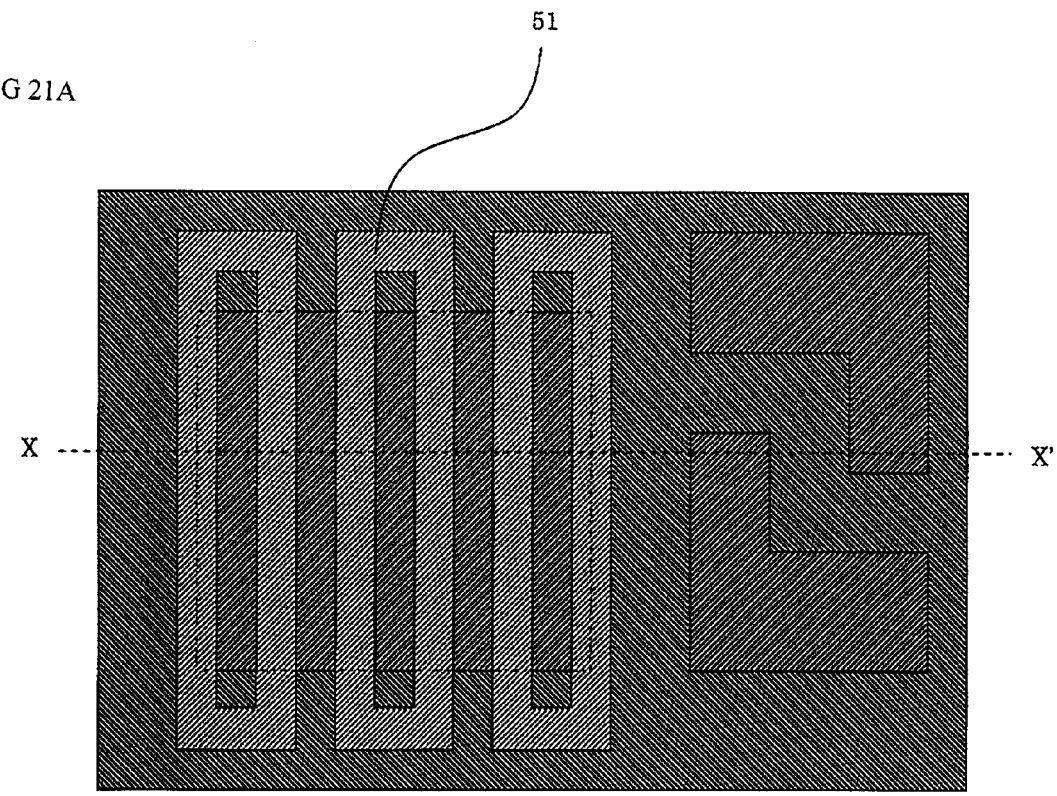
FIG. 21(a) is a plan view.
Figure 21B:
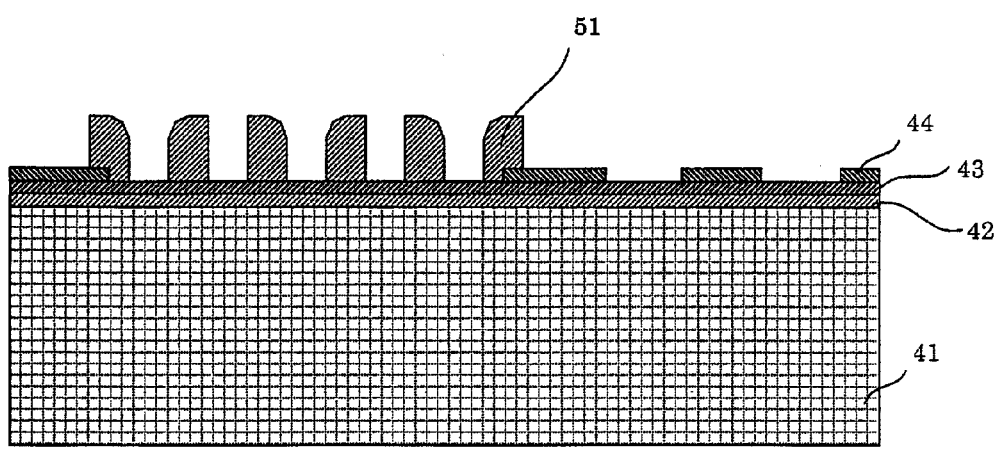
FIG. 21(b) is a cross sectional view taken along the line X-X' of FIG. 21(a)

Next, as illustrated in FIGS. 21(a) and 21(b), the BARC layer 47 is stripped, to thereby complete a hard mask of the side wall spacers 51. With reference to FIG. 21(a), the side wall spacer 51 has a loop-like shape, and a part of the side wall spacer 51 extends outwardly beyond a boundary of the opening portion formed in the titanium nitride layer 44, and overlaps with the titanium nitride layer 44.

Figure 22A:
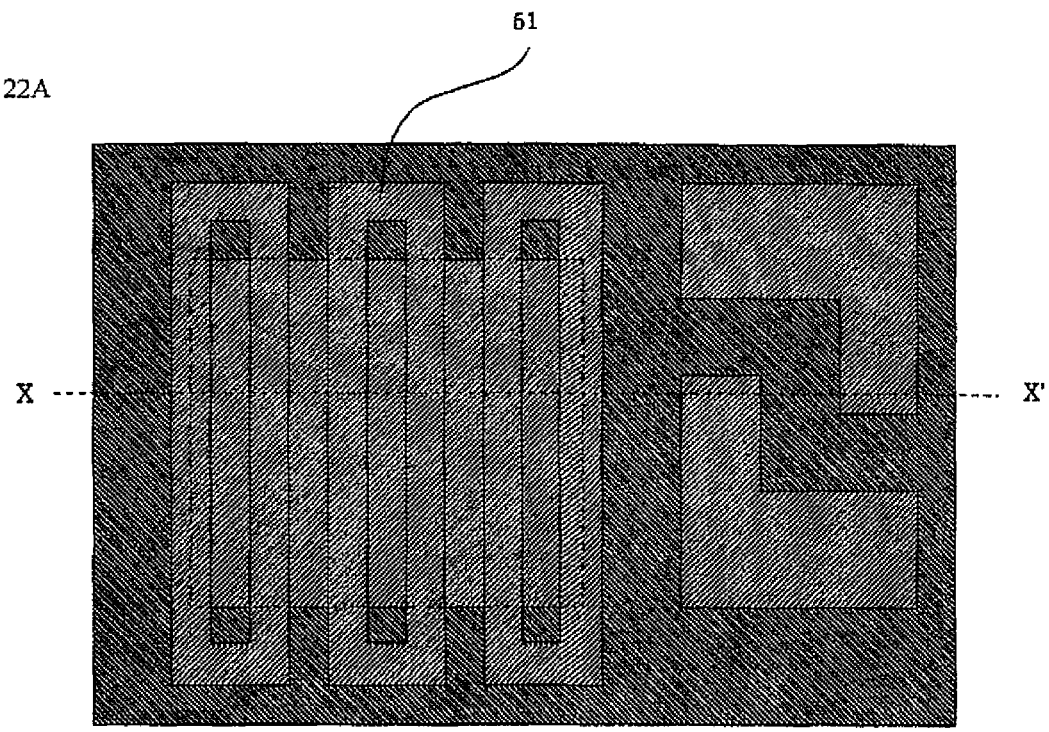
FIG. 22(a) is a plan view.
Figure 22B:
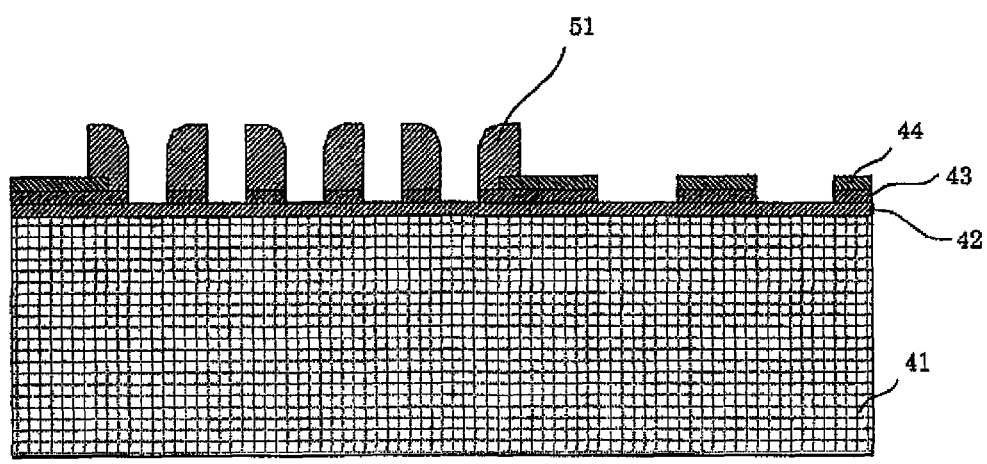
FIG. 22(b) is a cross sectional view taken along the line X-X' of FIG. 22(a)

Next, as illustrated in FIGS. 22(a) and 22(b), the silicon nitride layer 43 is etched using the side wall spacers 51 and the titanium nitride layer 44 as masks. As a result, the pattern formed in the polycrystalline silicon layer 44, which includes the reverse patterns 45 of the island-like patterns, and the pattern formed by the side wall spacers 51 may be combined on the silicon nitride layer 43.

Figure 23A:
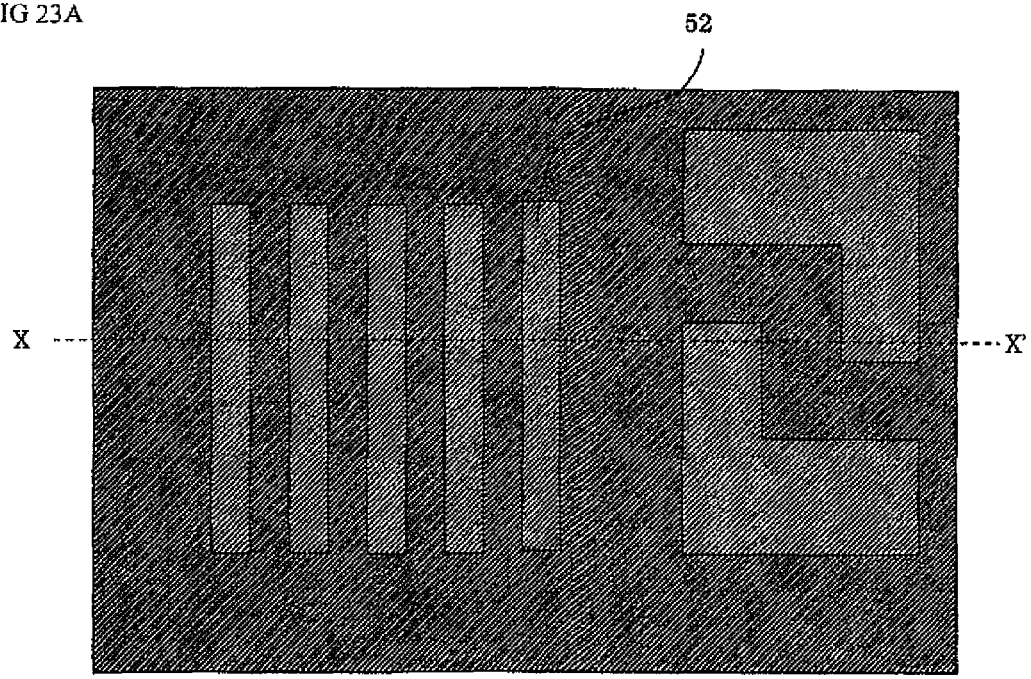
FIG. 23(a) is a plan view.
Figure 23B:
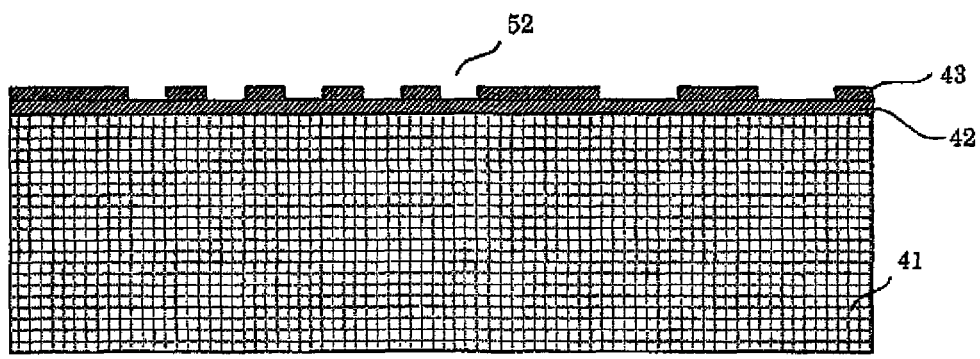
FIG. 23(b) is a cross sectional view taken along the line X-X' of FIG. 23(a)

Next, as illustrated in FIGS. 23(a) and 23(b), the side wall spacers 51 and the titanium nitride layer 44 are removed by etching.

Figure 24A:
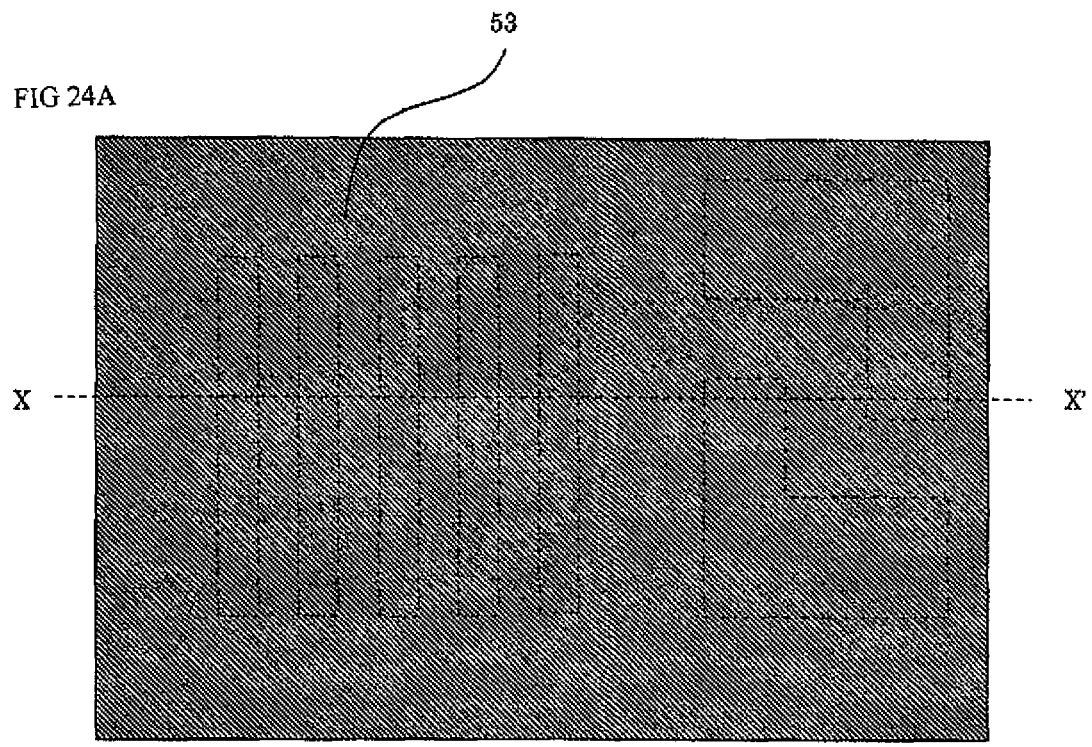
FIG. 24(a) is a plan view.
Figure 24B:
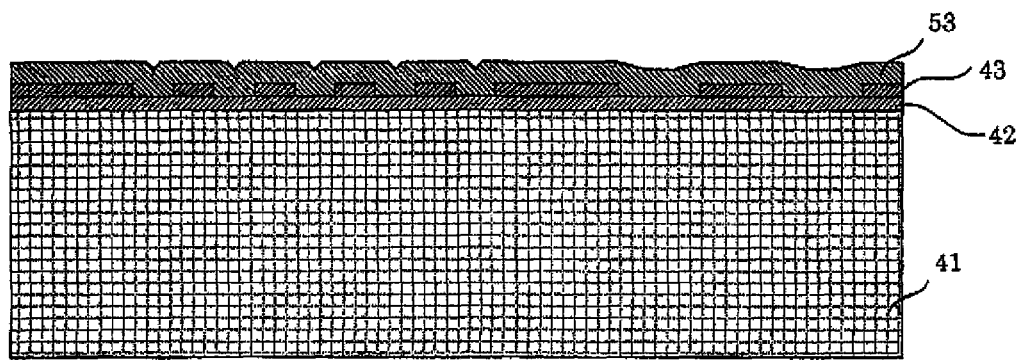
FIG. 24(b) is a cross sectional view taken along the line X-X' of FIG. 24(a)

Subsequently, as illustrated in FIGS. 24(a) and 24(b), a polycrystalline silicon layer 53 is formed over the entire surface.

Figure 25A:
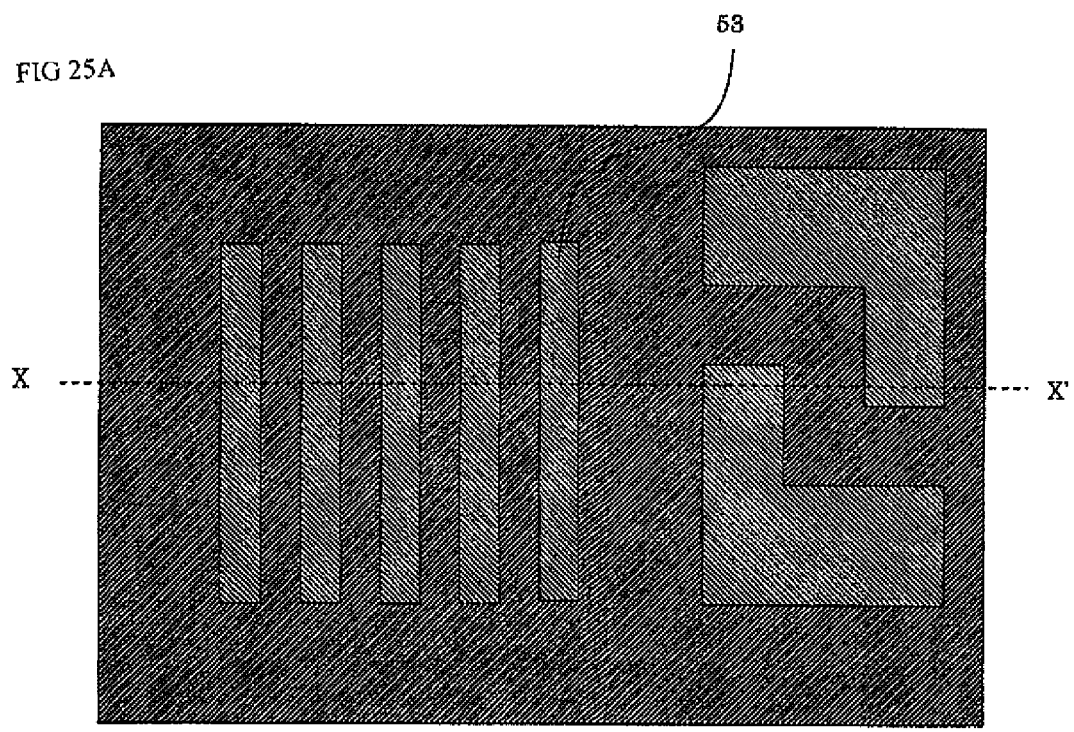
FIG. 25(a) is a plan view.
Figure 25B:
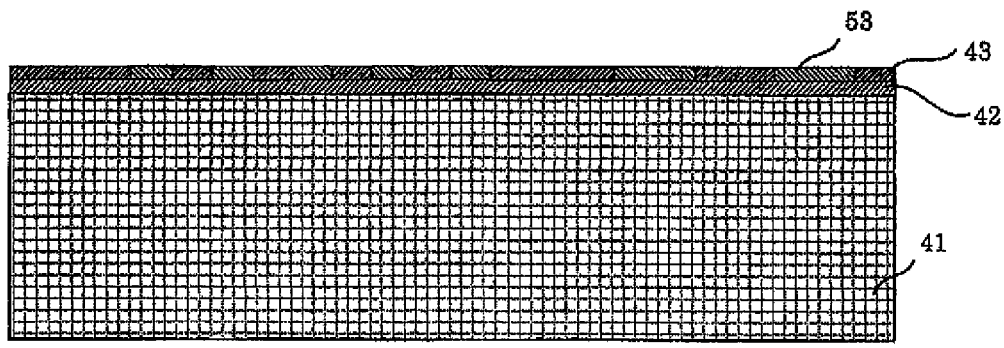
FIG. 25(b) is a cross sectional view taken along the line X-X' of FIG. 25(a)

Next, as illustrated in FIGS. 25(a) and 25(b), a surface of the polycrystalline silicon layer 53 is polished by chemical mechanical polishing (CMP). As a result, a surface of the silicon nitride layer 43 is exposed.

Figure 26A:
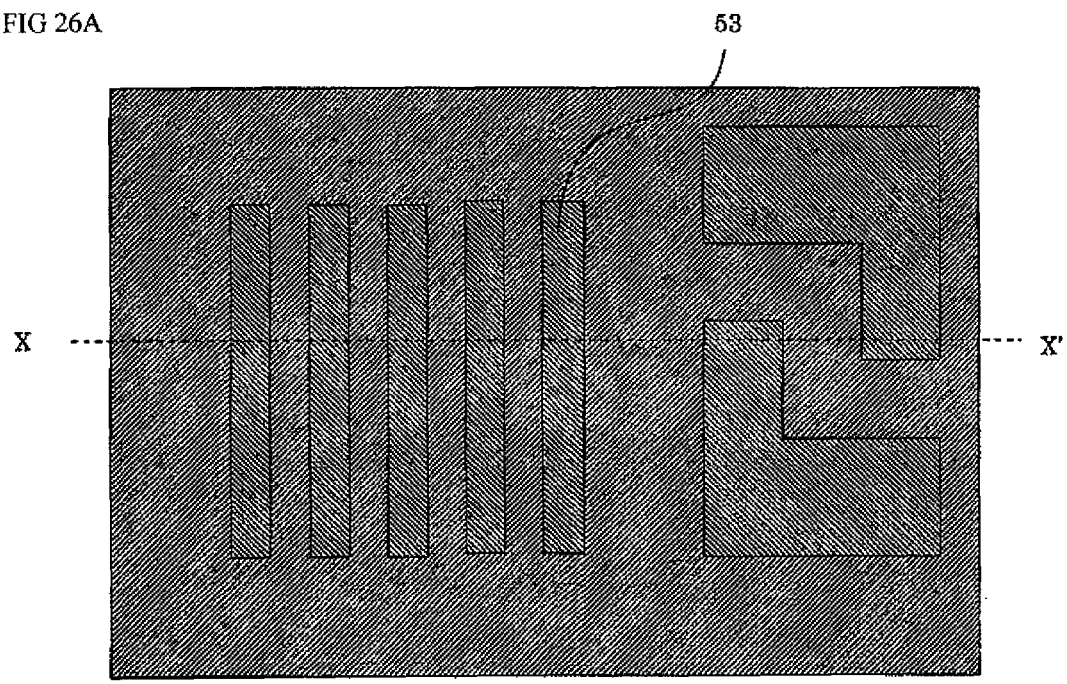
FIG. 26(a) is a plan view.
Figure 26B:
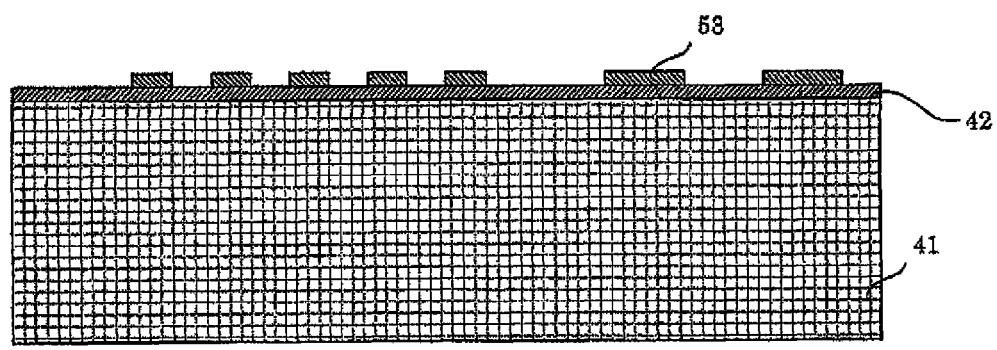
FIG. 26(b) is a cross sectional view taken along the line X-X' of FIG. 26(a)

Subsequently, as illustrated in FIGS. 26(a) and 26(b), the exposed silicon nitride layer 43 is removed by etching. As a result, a hard mask, which includes an arrangement of line patterns each having a width of 30 nm and island-like patterns of an arbitrary size, is completed.

Figure 27A:
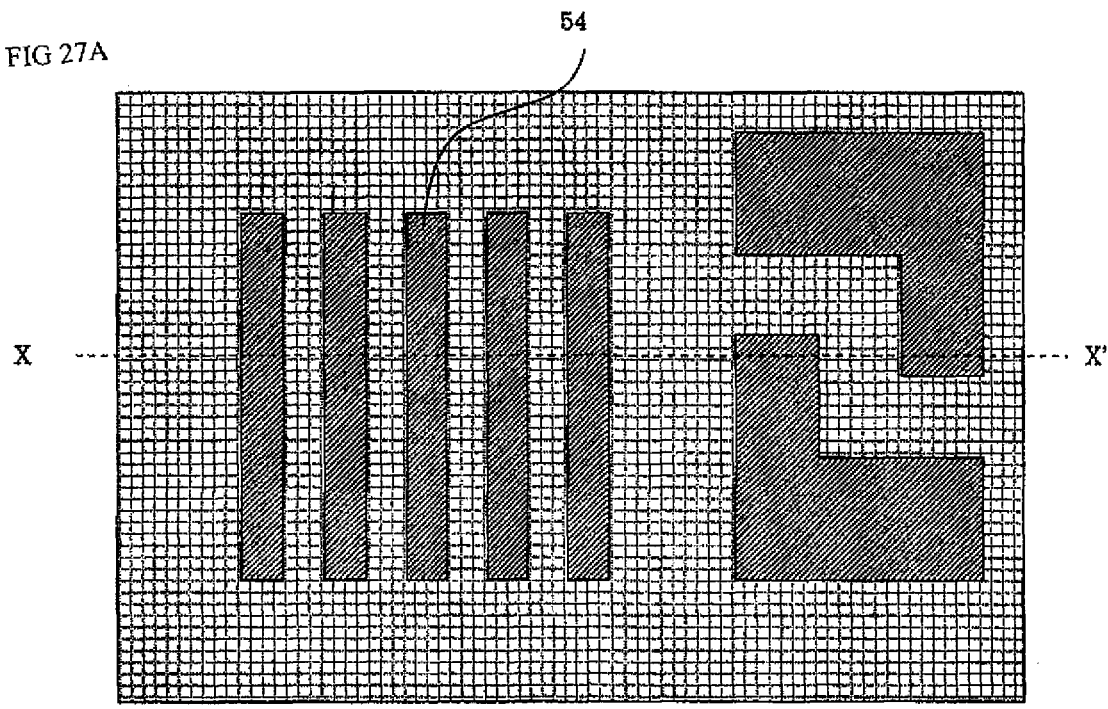
FIG. 27(a) is a plan view.
Figure 27B:
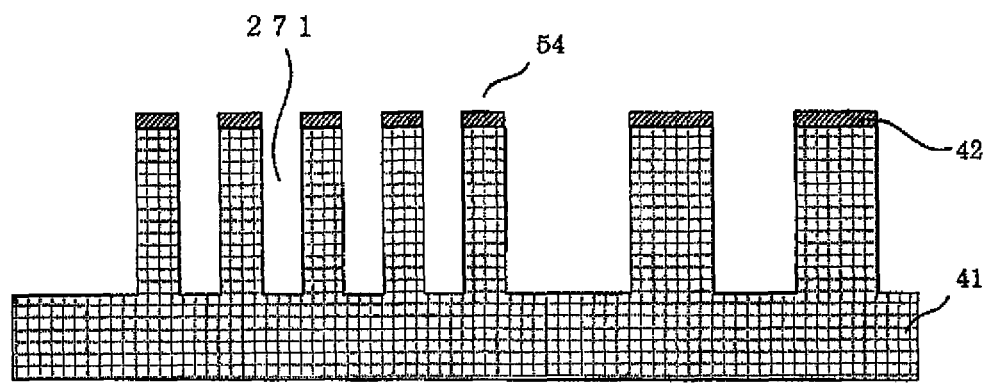
FIG. 27(b) is a cross sectional view taken along the line X-X' of FIG. 27(a)
Figure 28A:
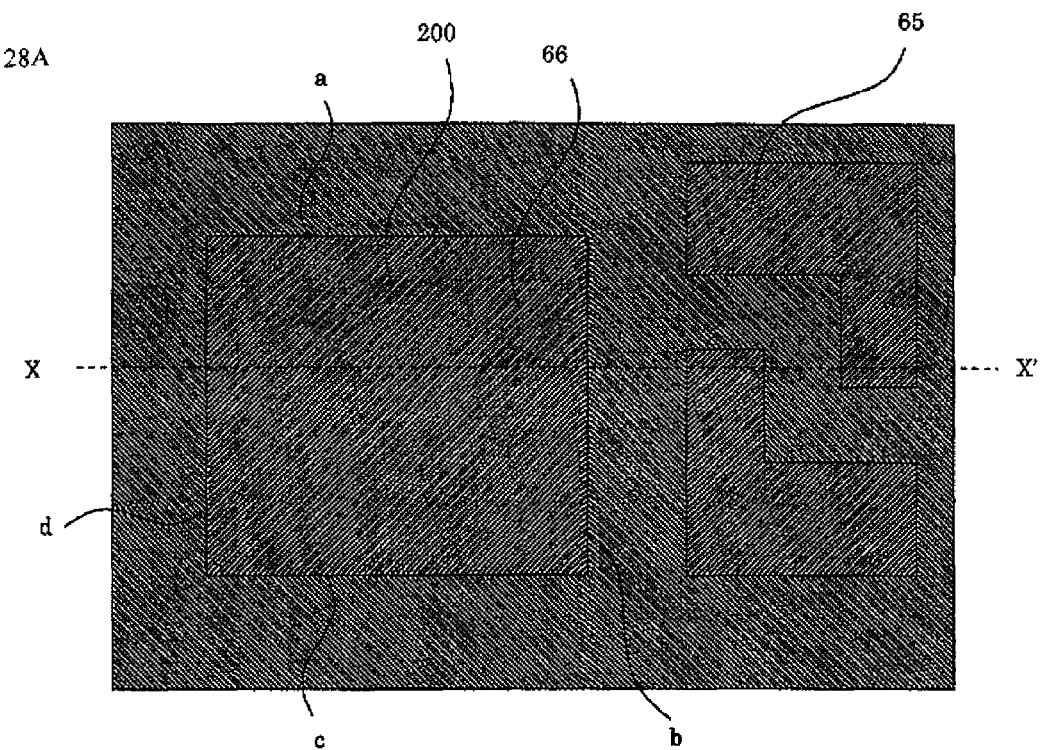
FIG. 28(a) is a plan view.
Figure 28B:
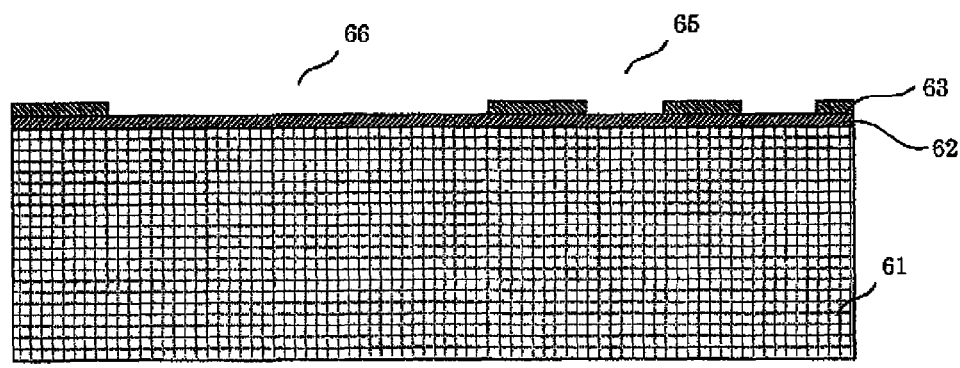
FIG. 28(b) is a cross sectional view taken along the line X-X' of FIG. 28(a)
Figure 29A:
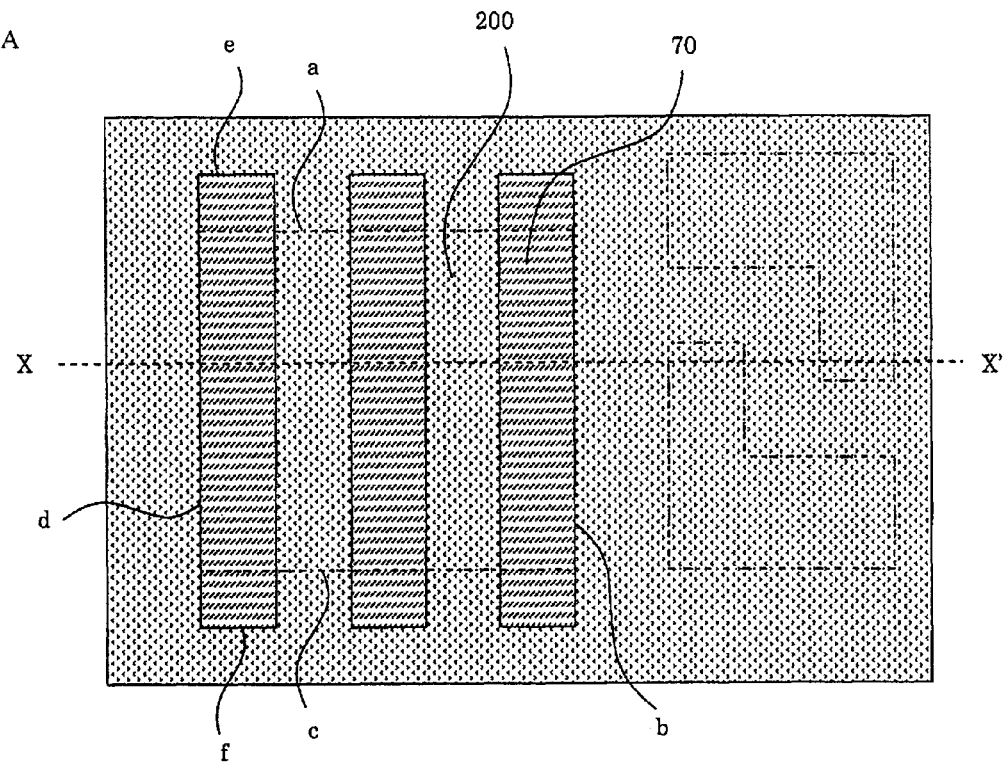
FIG. 29(a) is a plan view.
Figure 29B:
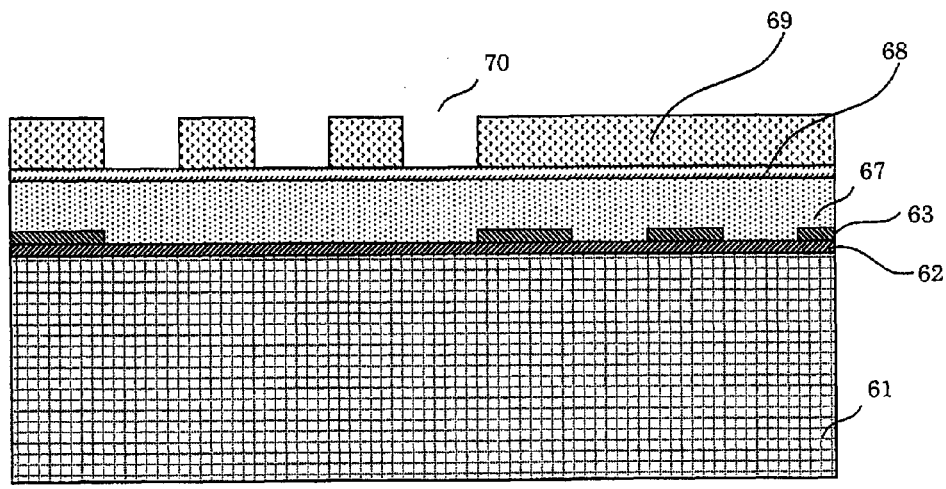
FIG. 29(b) is a cross sectional view taken along the line X-X' of FIG. 29(a)
Figure 30A:
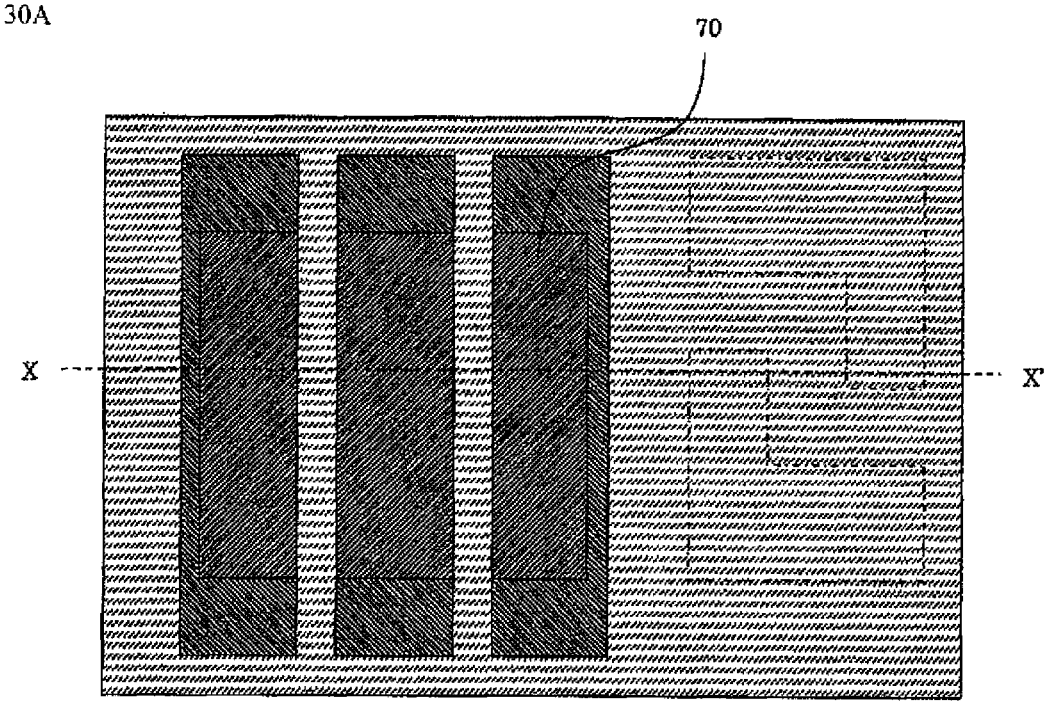
FIG. 30(a) is a plan view.
Figure 30B:
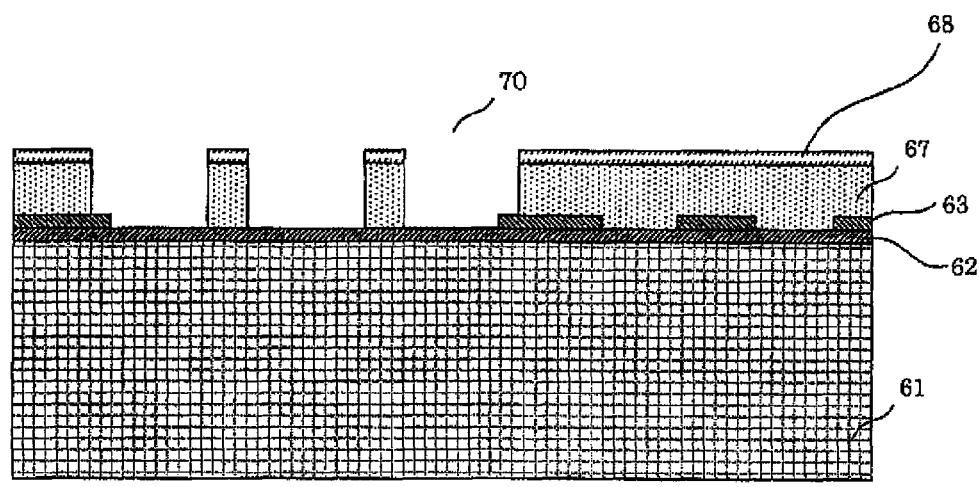
FIG. 30(b) is a cross sectional view taken along the line X-X' of FIG. 30(a)

Next, as illustrated in FIGS. 27(a) and 27(b), the silicon oxide layer 42 is patterned using the polycrystalline silicon layer 53 as a mask. After that, the silicon substrate 41 being the material to be processed is etched using the silicon oxide layer 42 as a mask. As a result, trenches 271 for shallow trench isolation (STI) are obtained.

In this embodiment, similarly to the first exemplary embodiment, the pattern including the pattern that covers the region other than the microfabrication region and the pattern of an arbitrary size is formed in the hard mask in advance. After that, the pattern using the side wall spacers is formed. The underlying layer is etched by combining the pattern formed in the hard mask and the pattern formed of the side wall spacers. In this manner, there may be avoided a trouble that the side wall spacers are formed on the side walls of the pattern of an arbitrary size, and further, it is not necessary to perform a photolithography step in a state where the hard mask of fine side wall spacers is formed.

In addition, in this embodiment, the polycrystalline silicon layer is deposited over an entire surface of the silicon nitride layer including the pattern obtained by combining the pattern formed in the hard mask and the pattern formed of the side wall spacers. The surface of the deposited polycrystalline silicon layer is planarized by CMP. The exposed silicon nitride layer is removed. As a result, there may be obtained the pattern in which the light pattern portion and the dark pattern portion in the pattern obtained by combining the pattern formed in the hard mask and the pattern formed of the side wall spacers are reversed. Accordingly, the fine line pattern arrangement is obtained in the microfabrication region, and the region other than the microfabrication region becomes the light pattern portion with an island-like pattern of an arbitrary size being formed therein. The obtained pattern is suitable, for example, for a shallow trench isolation (STI) formation step in the manufacturing process for a semiconductor device.

Fourth Exemplary Embodiment

Next, a manufacturing process for a semiconductor device according to a fourth exemplary embodiment is described.

FIGS. 28 to 36 are views illustrating the manufacturing process for the semiconductor device according to the fourth exemplary embodiment, particularly, steps of forming a hard mask to process an underlying layer. FIGS. 28(a), 29(a), 30(a), 31(a), 32(a), 33(a), 34(a), 35(a), and 36(a) are plan views, and FIGS. 28(b), 29(b), 30(b), 31(b), 32(b), 33(b), 34(b), 35(b), and 36(b) are cross sectional views respectively taken along the lines X-X' of FIGS. 28(a), 29(a), 30(a), 31(a), 32(a), 33(a), 34(a), 35(a), and 36(a).

Similarly to the third embodiment, the following case is described. There are schematically arranged: a pattern in which five line patterns (dark pattern portions), which are formed using side wall spacers as a hard mask, are arranged, in a microfabrication region 66 typified by the memory cell array region; and island-like patterns each serving as an example of a pattern of an arbitrary size in a region other than the microfabrication region 66. Another region other than the microfabrication region 66 and other than the region in which the island-like patterns are formed is a light pattern portion.

FIGS. 28(a) to 32(a) and FIGS. 28(b) to 32(b) are substantially the same as FIGS. 17(a) to 21(a) and FIGS. 17(b) to 21(b) of the third exemplary embodiment, respectively, except for the following points. Therefore, with regard to FIGS. 28 to 32, only the difference from FIGS. 17 to 21 is described, and other description thereof is omitted. The number of hard mask layers used in the fourth exemplary embodiment is smaller than that used in the third exemplary embodiment by one. Specifically, in the fourth exemplary embodiment, there is not formed a film corresponding to the silicon nitride layer 43 of the third exemplary embodiment.

The fourth exemplary embodiment is greatly different from the third exemplary embodiment with regard to the structure of FIGS. 33 and 34.

Figure 33A:
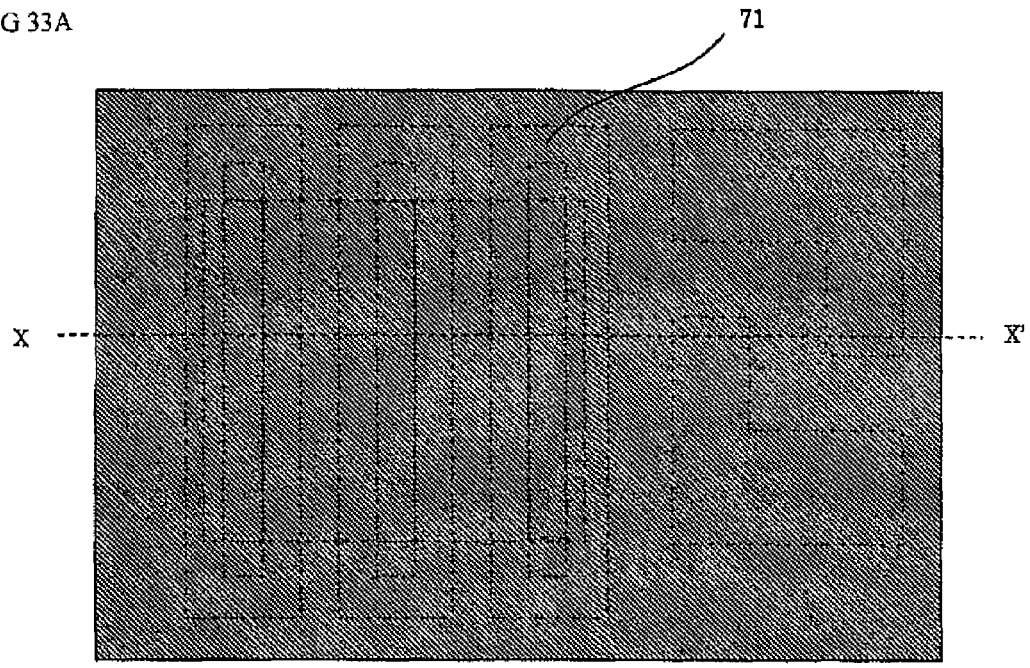
FIG. 33(a) is a plan view.
Figure 33B:
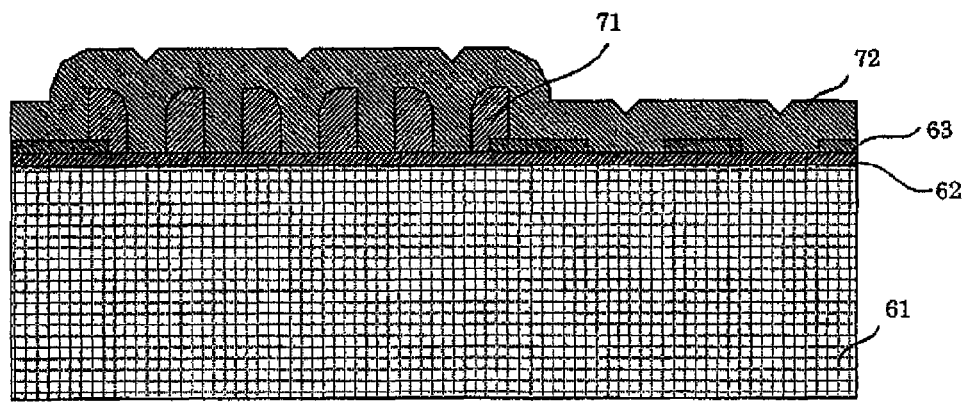
FIG. 33(b) is a cross sectional view taken along the line X-X' of FIG. 33(a)

With reference to FIGS. 33(a) and 33(b), a first hard mask material layer 63 is formed by patterning in advance before forming side wall spacers 71. Then, a hard mask pattern is formed of the side wall spacers 71. After that, a second hard mask material layer 72 is formed over the entire surface.

Figure 34A:
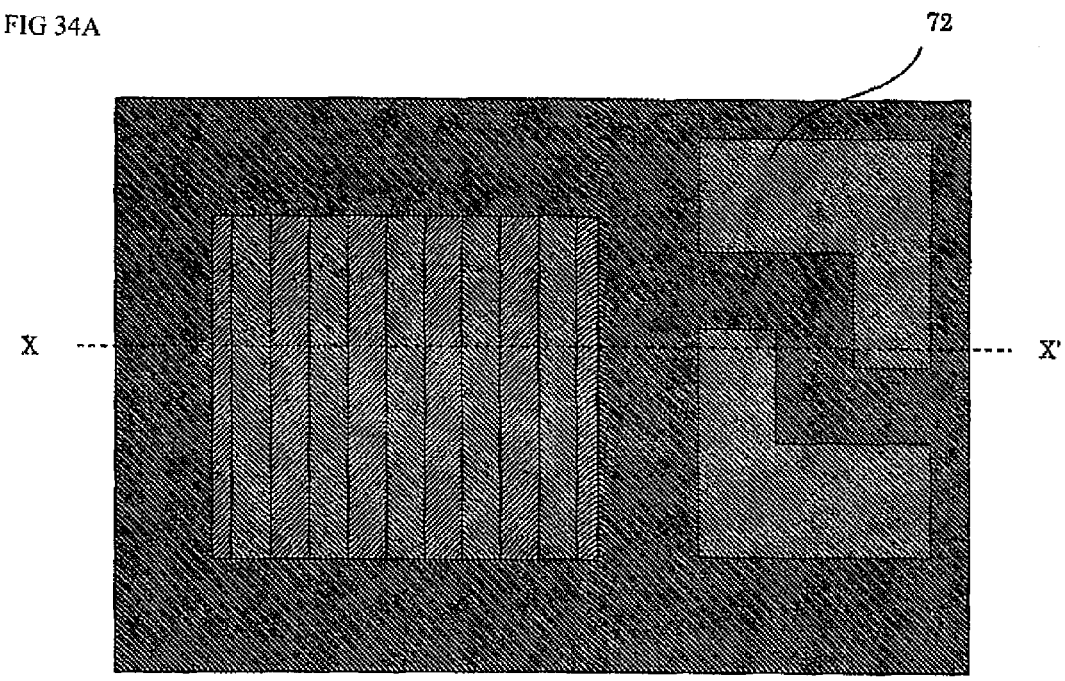
FIG. 34(a) is a plan view.
Figure 34B:
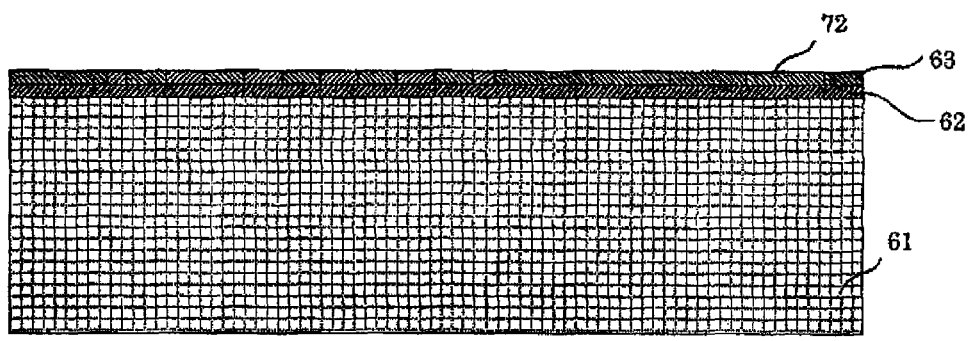
FIG. 34(b) is a cross sectional view taken along the line X-X' of FIG. 34(a)

Next, as illustrated in FIGS. 34(a) and 34(b), a surface of the second hard mask material layer 72 is polished by CMP, to thereby expose a surface of the first hard mask material layer 63.

Figure 35A:
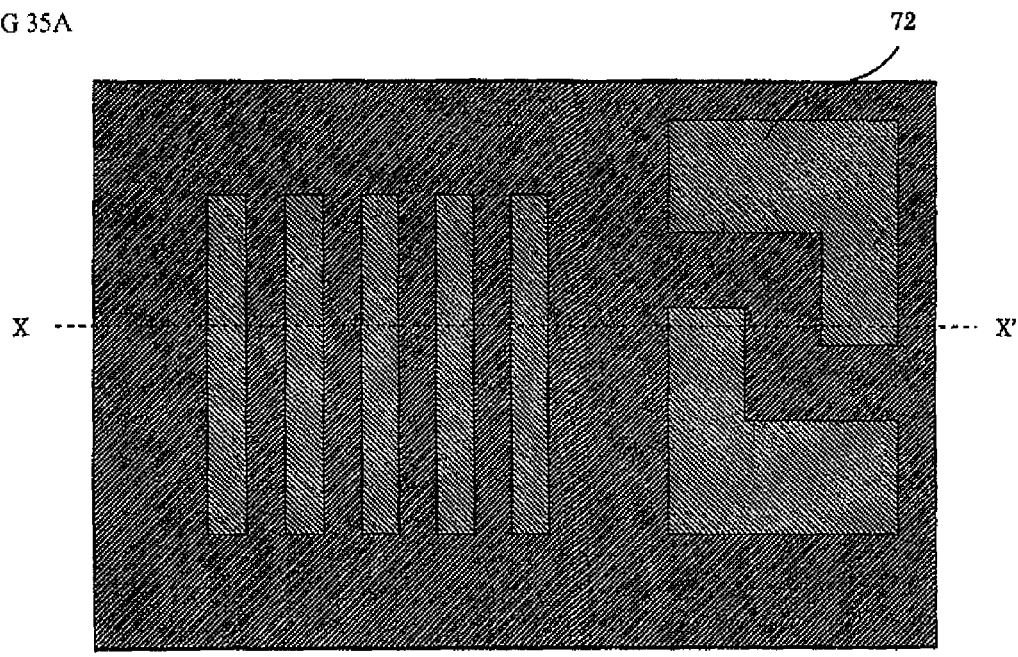
FIG. 35(a) is a plan view.
Figure 35B:
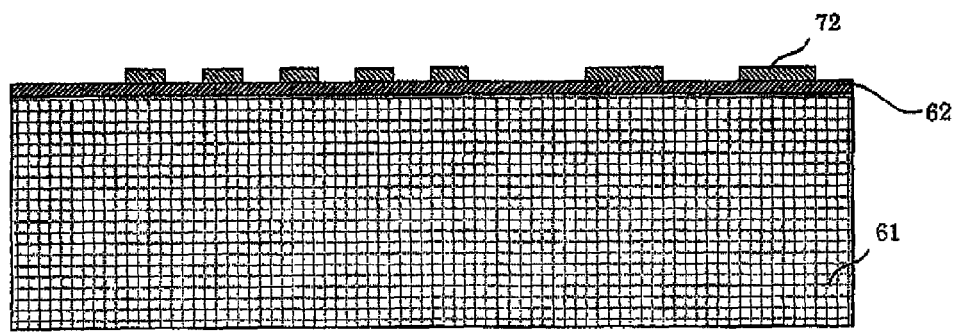
FIG. 35(b) is a cross sectional view taken along the line X-X' of FIG. 35(a)

Subsequently, as illustrated in FIGS. 35(a) and 35(b), the exposed side wall spacers 71 and the exposed first hard mask material layer 63 are removed by etching, to thereby complete a hard mask formed of the second hard mask material layer 72.

Figure 31A:
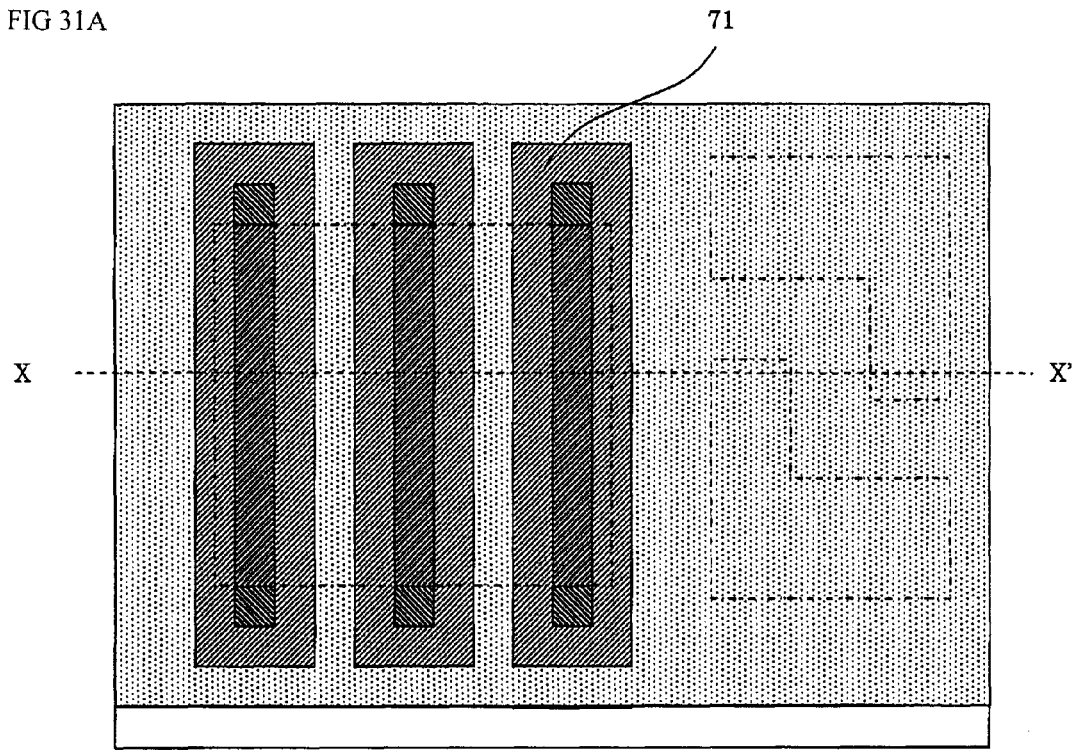
FIG. 31(a) is a plan view.
Figure 31B:
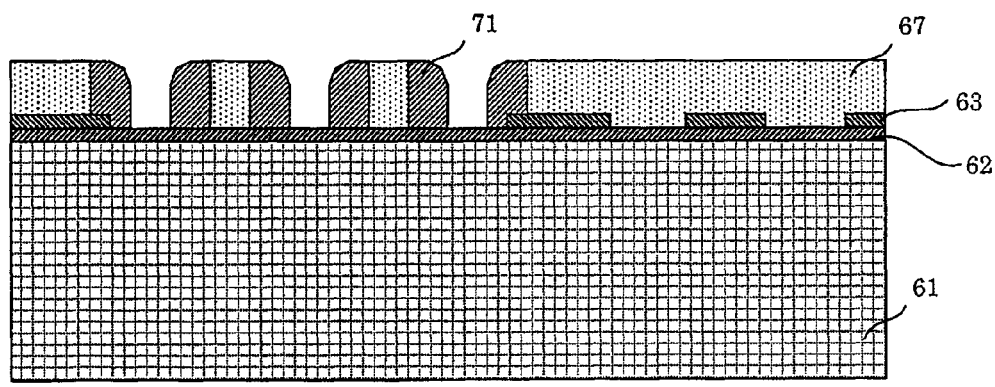
FIG. 31(b) is a cross sectional view taken along the line X-X' of FIG. 31(a)
Figure 32A:
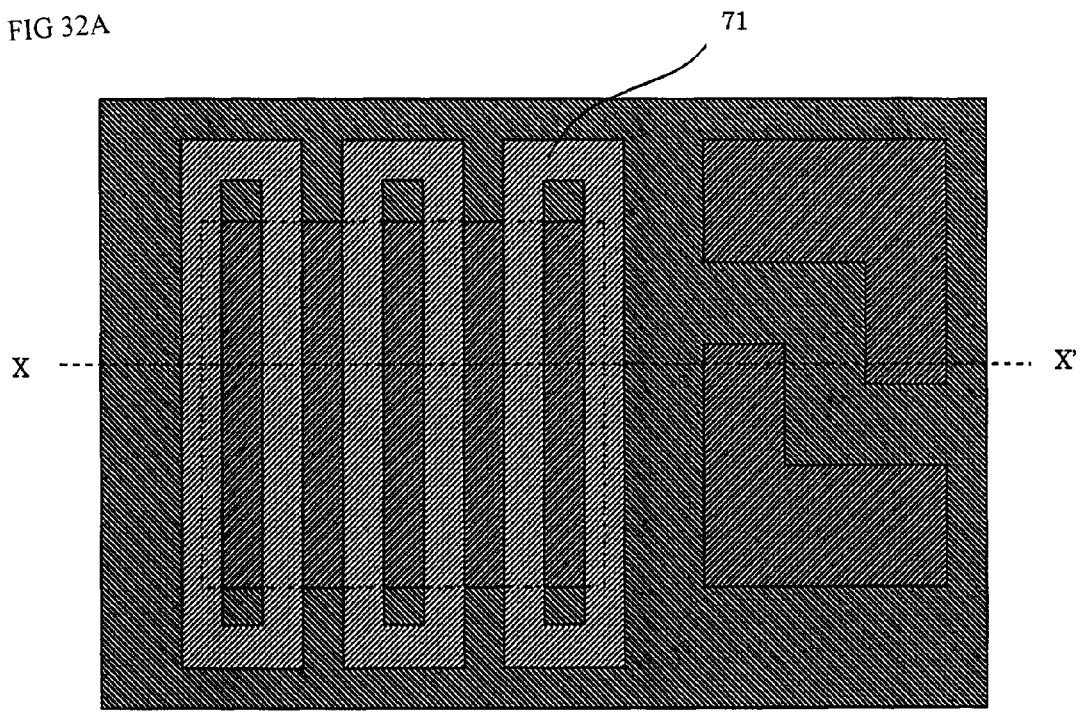
FIG. 32(a) is a plan view.
Figure 32B:
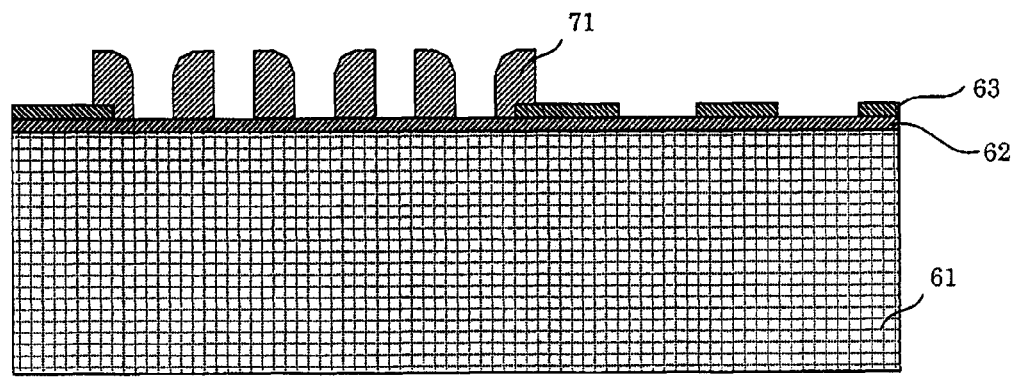
FIG. 32(b) is a cross sectional view taken along the line X-X' of FIG. 32(a)

Further, with the material for each layer being appropriately selected, a side wall core layer 67 is not removed in a state as illustrated in FIGS. 31(a) and 31(b) while the second hard mask material layer 72 is deposited over the entire surface of the substrate, and then the surface of the substrate is planarized by CMP, to thereby remove the exposed side wall spacers 71 and the exposed first hard mask material layer 63. In this manner, a hard mask formed of the side wall core layer 67 and the second hard mask material layer 72 is completed.

As described above, similarly to the third exemplary embodiment, also in this embodiment, there may be obtained the pattern in which the light pattern portion and the dark pattern portion in the pattern obtained by combining the pattern formed in the hard mask and the pattern formed of the side wall spacers are reversed. However, in this embodiment, the pattern may be formed with reduced number of layers and reduced number of steps.

Figure 36A:
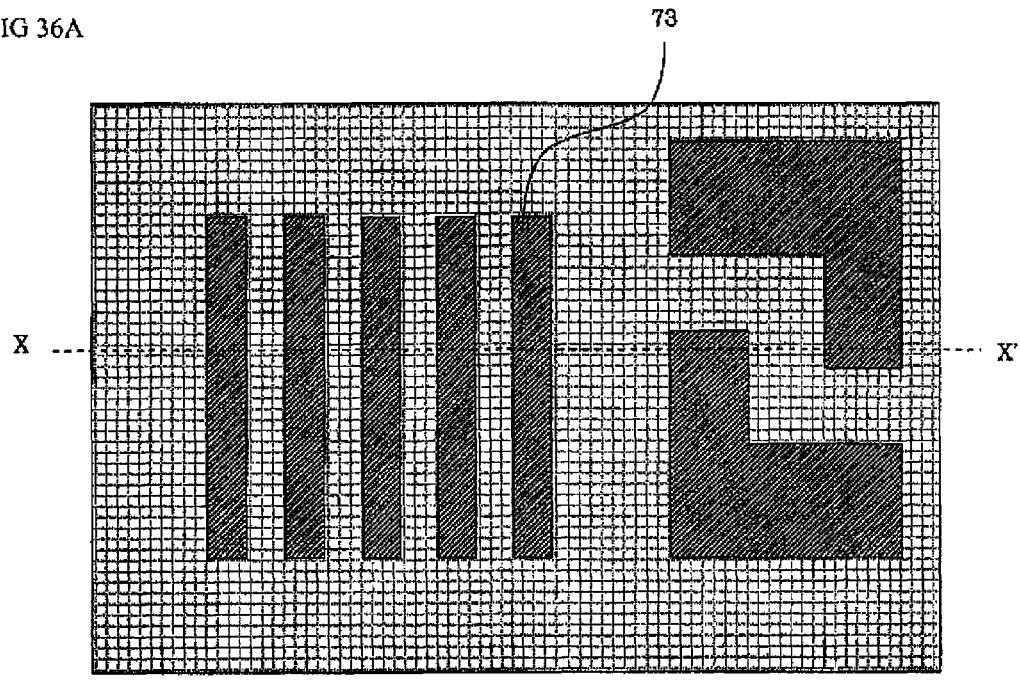
FIG. 36(a) is a plan view.
Figure 36B:
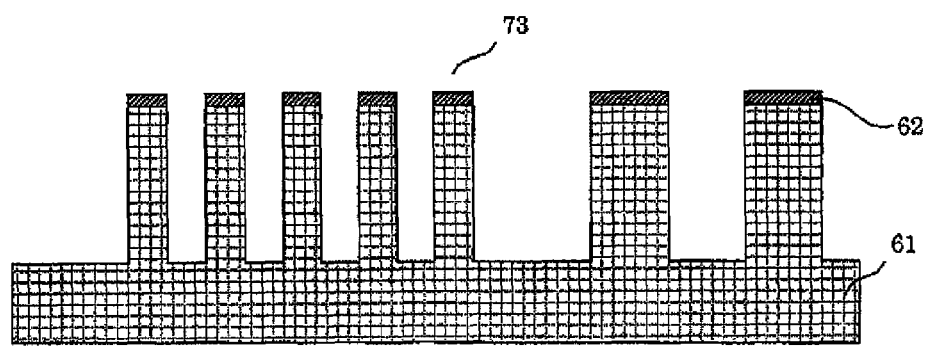
FIG. 36(b) is a cross sectional view taken along the line X-X' of FIG. 36(a)

Next, subsequently to the step of FIGS. 36(a) and 36(b), the step of FIGS. 37(a) and 37(b) is performed. These steps are the same as the step of FIGS. 26(a) and 26(b) and the step of FIGS. 37(a) and 37(b) in the third exemplary embodiment, respectively, and hence description thereof is omitted.

According to the embodiments described above, it is sufficient to perform two photolithography steps in total, that is, a step of forming a first hard mask pattern and a step of forming a pattern of a size smaller than a resolution limit of lithography. Therefore, it is possible to form a pattern including both the pattern of a size smaller than a resolution limit of lithography and the pattern of an arbitrary size, only with the two photolithography steps. Further, the embodiments are suitable for forming a line-and-space pattern having no "loop-like portion" in which end portions of different lines or end portions of different spaces are connected to each other. Still further, when a space pattern or a hole pattern of a size smaller than a resolution limit of lithography is to be formed, there may be provided a manufacturing method for a semiconductor device, which may be applied to formation of a large pattern that covers an entire surface of a region other than a region in which such a fine pattern is formed. Moreover, it is possible to form a pattern of an arbitrary size in a hard mask in advance, and at the same time, to perform a process of isolating a space pattern. The hard mask of side wall spacers is formed, and then a photoresist is applied to a thus formed substrate. Therefore, a step of forming a pattern of the photoresist is not necessary, and further, the side wall spacer is not formed on side walls of the pattern of an arbitrary size.

In the embodiments described above, the side wall films are formed on the side walls of the core pattern, and then the core pattern is removed to form the side wall spacers. However, in order to form a finer line-and-space pattern, the following step may be repeated at least once to form final side wall spacers having a predetermined fine width. That is, other side wall films are formed on side walls of the formed side wall spacers, and the formed side wall spacers are removed, to thereby form side wall spacers having a smaller width. The side wall spacers thus formed may be applied to each of the embodiments. The details of a technology of reducing a width of the side wall spacer step-by-step is described in U.S. Pat. No. 6,063,688. Herein, U.S. Pat. No. 6,063,688 is incorporated by reference.

With the disclosure of this invention described above, a person skilled in the art should understand that various selections are possible in terms of design within the scope of this invention. For example, the number of material layers, which are processed using a hard mask pattern formed in a hard mask layer in which a combined pattern is formed, may be one or more. In the embodiments described above, the formation of the isolation trenches and the formation of the metal plug openings in the manufacturing process for the PRAM are specifically described. However, this invention is not limited thereto, and may be applied to a case where various shapes such as patterns are formed in an insulating layer, a semiconductor layer, a metal layer, or the like in order to fabricate various elements that constitute a semiconductor device in the manufacturing process for the semiconductor device.

The various embodiments and advantages of this invention have been described above, but the above description is given merely as an example. Therefore, rational changes may be made without departing from the scope of this invention, and thus this invention should not be limited to the above description.

What is claimed is:

1. A manufacturing method for a semiconductor device, comprising:
    forming a first layer on a member to be etched;
    forming a first hard mask that includes a first hard mask pattern, in the first layer;
    forming a second layer on the first hard mask and on an exposed surface of the member to be etched;
    removing by selective etching the second layer to form a side wall core that includes a core pattern;
    forming side wall spacers on side walls of the side wall core; and
    using the side wall spacers and the first hard mask to remove by etching the member to be etched.

2. A manufacturing method for a semiconductor device according to claim 1, wherein the forming a side wall core comprises etching the side wall core in a layer direction of the second layer.

3. A manufacturing method for a semiconductor device according to claim 1, wherein the first hard mask pattern includes:
    a pattern including an opening that defines a microfabrication region of the member to be etched; and
    a pattern that defines a process region of an arbitrary size.

4. A manufacturing method for a semiconductor device according to claim 3, wherein:
    the side wall core includes at least one opening that crosses the opening that defines the microfabrication region, of the first hard mask pattern; and
    a region that defines the process region of the arbitrary size, of the first hard mask pattern is covered with the second layer.

5. A manufacturing method for a semiconductor device according to claim 3, wherein the side wall spacers are not formed on side walls of the first hard mask pattern.

6. A manufacturing method for a semiconductor device according to claim 5, wherein:
    the member to be etched includes a third layer; and
    the manufacturing method for a semiconductor device further comprises forming a hard mask pattern in the third layer using the first hard mask and the side wall spacers as masks.

7. A manufacturing method for a semiconductor device according to claim 6, wherein:
    the member to be etched further includes a fourth layer formed below the third layer and a semiconductor member formed below the fourth layer; and
    the manufacturing method for a semiconductor device further comprises patterning the fourth layer and the semiconductor member with the hard mask pattern formed in the third layer to process the semiconductor member.

8. A manufacturing method for a semiconductor device according to claim 6, wherein:
    the member to be etched further includes a semiconductor member formed below the third layer; and
    the manufacturing method for a semiconductor device further comprises patterning the semiconductor member with the hard mask pattern formed in the third layer to process the semiconductor member.

9. A manufacturing method for a semiconductor device according to claim 3, wherein the side wall core has a regular arrangement of islands in the opening that defines the microfabrication region, of the first hard mask pattern.

10. A manufacturing method for a semiconductor device according to claim 9, wherein, in the regular arrangement of the islands, first arrays and second arrays are alternately arranged with an interval therebetween in the opening that defines the microfabrication region, the first arrays each including a plurality of islands arranged at a predetermined pitch in one direction, the second arrays each being arranged in parallel to the first arrays and being shifted by half the predetermined pitch of the plurality of islands included in the first arrays, the interval between each of the first arrays and each of the second arrays being equal to half the predetermined pitch.

11. A manufacturing method for a semiconductor device according to claim 9, wherein the forming side wall spacers comprises:
    forming side wall films on side walls of the islands of the side wall core; and
    etching the side wall films so that the member to be etched is exposed at portions between adjacent islands.

12. A manufacturing method for a semiconductor device according to claim 11, wherein the side wall spacers are formed so that the member to be etched is exposed at locations in which the islands of the side wall core were formed and at the portions between the adjacent islands.

13. A manufacturing method for a semiconductor device according to claim 12, wherein:
the member to be etched includes a third layer; and
the manufacturing method for a semiconductor device further comprises forming a pattern in the third layer using the first hard mask and the side wall spacers as masks to form a hard mask pattern in the third layer.

14. A manufacturing method for a semiconductor device according to claim 13, wherein:
the member to be etched further includes an insulating member formed below the third layer; and
the manufacturing method for a semiconductor device further comprises patterning the insulating member with the hard mask pattern formed in the third layer to process the insulating member.

15. A manufacturing method for a semiconductor device according to claim 6, further comprising:
forming a fourth layer on the hard mask pattern formed in the third layer;
processing the fourth layer so that the third layer is exposed;
removing the third layer; and
forming a hard mask pattern in the fourth layer.

16. A manufacturing method for a semiconductor device according to claim 15, wherein:
the member to be etched includes a semiconductor member formed below the third layer; and
the manufacturing method for a semiconductor device further comprises patterning the semiconductor member with the hard mask pattern formed in the fourth layer to form a trench in the semiconductor member.

17. A manufacturing method for a semiconductor device according to claim 3, further comprising:
depositing, after removing the side wall core, a third layer on exposed surfaces of the side wall spacers, an exposed surface of the first hard mask, and the exposed surface of the member to be etched;
processing the third layer and the side wall spacers so that the first layer is exposed; and
removing the first layer to form a hard mask pattern in the third layer.

18. A manufacturing method for a semiconductor device according to claim 17, wherein:
the member to be etched includes a semiconductor member formed below a hard mask layer of the third layer; and
the manufacturing method for a semiconductor device further comprises patterning the semiconductor member with the hard mask pattern formed in the third layer to process the semiconductor member.

19. A manufacturing method for a semiconductor device according to claim 3, further comprising:
depositing a third layer on the side wall spacers and the first hard mask;
processing the third layer and the side wall spacers so that the first layer is exposed; and
removing the first layer to form a hard mask pattern in the third layer.

20. A manufacturing method for a semiconductor device which is manufactured by processing material layers such as a semiconductor layer, an insulating layer, and a metal layer that constitute elements included in the semiconductor device, the manufacturing method comprising:
forming a first layer on a member to be etched;
forming a first hard mask that includes a first hard mask pattern, in the first layer;
forming a second layer on the first hard mask and on an exposed surface of the member to be etched;
removing by selective etching the second layer to form a side wall core that includes a core pattern;
forming side wall spacers on side walls of the side wall core;
performing at least once a process of forming other side wall spacers having a smaller width on side walls of the formed side wall spacers, to thereby form final side wall spacers having a predetermined fine width;
forming a combined hard mask pattern in the member to be etched using the final side wall spacers and the first hard mask; and
transferring the combined hard mask pattern onto the material layers to process by etching the material layer.

* * * * *